(12) United States Patent
Tanitsu et al.

(10) Patent No.: US 8,456,624 B2
(45) Date of Patent: Jun. 4, 2013

(54) INSPECTION DEVICE AND INSPECTING METHOD FOR SPATIAL LIGHT MODULATOR, ILLUMINATION OPTICAL SYSTEM, METHOD FOR ADJUSTING THE ILLUMINATION OPTICAL SYSTEM, EXPOSURE APPARATUS, AND DEVICE MANUFACTURING METHOD

(75) Inventors: Osamu Tanitsu, Kumagaya (JP); Hirohisa Tanaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/952,197

(22) Filed: Nov. 22, 2010

(65) Prior Publication Data

US 2011/0069305 A1     Mar. 24, 2011

Related U.S. Application Data

(63) Continuation of application No. PCT/JP2009/058802, filed on May 12, 2009.

(30) Foreign Application Priority Data

May 28, 2008   (JP) ................. 2008-138841

(51) Int. Cl.
*G01N 21/00*   (2006.01)
(52) U.S. Cl.
USPC .................................... 356/237.2
(58) Field of Classification Search
USPC ..................................... 356/237.2
See application file for complete search history.

(56) References Cited

U.S. PATENT DOCUMENTS

| | | | |
|---|---|---|---|
| 4,346,164 | A | 8/1982 | Tabarelli et al. |
| 5,153,428 | A | 10/1992 | Ellis |
| 5,216,541 | A | 6/1993 | Takesue et al. |
| 5,251,222 | A * | 10/1993 | Hester et al. ............ 372/26 |
| 5,383,000 | A | 1/1995 | Michaloski et al. |
| 5,461,410 | A | 10/1995 | Venkateswar et al. |
| 5,850,310 | A | 12/1998 | Schweizer |
| 5,991,009 | A | 11/1999 | Nishi et al. |
| 6,406,148 | B1 | 6/2002 | Marshall et al. |
| 6,577,379 | B1 | 6/2003 | Boettiger et al. |

(Continued)

FOREIGN PATENT DOCUMENTS

| | | |
|---|---|---|
| CN | 1501175 A | 6/2004 |
| CN | 1573571 A | 2/2005 |

(Continued)

OTHER PUBLICATIONS

Office Action dated Jul. 5, 2011 in Chinese Patent Application No. 200880100940.0.

(Continued)

*Primary Examiner* — Tu Nguyen
(74) *Attorney, Agent, or Firm* — Oliff & Berridge, PLC

(57) ABSTRACT

There is disclosed an inspection device for inspecting a spatial light modulator having a plurality of optical elements arrayed two-dimensionally and controlled individually, said inspection device comprising, a conjugate optical system which is arranged optically downstream the spatial light modulator and which forms a conjugate plane optically conjugate with an array plane where the plurality of optical elements are arrayed, a photodetector having a detection surface arranged on or near the conjugate plane, and an inspection unit which inspects optical characteristics of the plurality of optical elements, based on a result of detection by the photodetector.

29 Claims, 10 Drawing Sheets

U.S. PATENT DOCUMENTS

| | | |
|---|---|---|
| 6,577,429 B1 | 6/2003 | Kurtz et al. |
| 6,665,119 B1 | 12/2003 | Kurtz et al. |
| 6,819,490 B2 | 11/2004 | Sandstrom et al. |
| 6,829,090 B2 | 12/2004 | Katsumata et al. |
| 6,900,915 B2 | 5/2005 | Nanjyo et al. |
| 6,913,373 B2 | 7/2005 | Tanaka et al. |
| 6,958,806 B2 | 10/2005 | Mulder et al. |
| 6,958,867 B2 | 10/2005 | Ohmori et al. |
| 6,960,035 B2 | 11/2005 | Okazaki et al. |
| 6,961,116 B2 | 11/2005 | Den Boef et al. |
| 6,977,718 B1 | 12/2005 | LaFontaine |
| 7,030,962 B2 | 4/2006 | Iizuka et al. |
| 7,061,226 B2 | 6/2006 | Durr |
| 7,095,546 B2 | 8/2006 | Mala et al. |
| 7,095,921 B2 | 8/2006 | Okazaki et al. |
| 7,116,403 B2 | 10/2006 | Troost et al. |
| 7,121,740 B2 | 10/2006 | Okazaki et al. |
| 7,130,120 B2 | 10/2006 | Katsumata et al. |
| 7,148,952 B2 | 12/2006 | Eurlings et al. |
| 7,177,012 B2 | 2/2007 | Bleeker et al. |
| 7,193,684 B2 | 3/2007 | Iizuka et al. |
| 7,259,827 B2 | 8/2007 | Dierichs |
| 7,289,276 B2 | 10/2007 | Ohmori et al. |
| 7,423,731 B2 | 9/2008 | Tanitsu et al. |
| 7,508,492 B2 | 3/2009 | Sekigawa et al. |
| 7,525,642 B2 | 4/2009 | Mulder et al. |
| 7,532,378 B2 | 5/2009 | Tanaka et al. |
| 7,542,129 B2 | 6/2009 | Sandstrom |
| 7,551,261 B2 | 6/2009 | Fiolka |
| 7,573,564 B2 | 8/2009 | Ruff et al. |
| 7,605,386 B2 | 10/2009 | Singer et al. |
| 7,701,555 B2 | 4/2010 | Arai |
| 7,714,983 B2 | 5/2010 | Koehler et al. |
| 7,965,380 B2 | 6/2011 | Bleeker et al. |
| 8,018,589 B2 | 9/2011 | MacKinnon et al. |
| 2003/0038225 A1 | 2/2003 | Mulder et al. |
| 2003/0071204 A1 | 4/2003 | Sandstrom et al. |
| 2003/0098959 A1 | 5/2003 | Hagiwara et al. |
| 2003/0214571 A1 | 11/2003 | Ishikawa et al. |
| 2004/0053148 A1 | 3/2004 | Morohoshi |
| 2004/0057034 A1 | 3/2004 | Zinn et al. |
| 2004/0100629 A1 | 5/2004 | Stokowski et al. |
| 2004/0108467 A1 | 6/2004 | Eurlings et al. |
| 2004/0160582 A1 | 8/2004 | Lof et al. |
| 2004/0207386 A1* | 10/2004 | Durr ................ 324/121 R |
| 2005/0024612 A1 | 2/2005 | Hirukawa et al. |
| 2005/0094122 A1 | 5/2005 | Hagiwara et al. |
| 2005/0141583 A1 | 6/2005 | Sandstrom |
| 2005/0168790 A1* | 8/2005 | Latypov et al. ........... 359/239 |
| 2005/0213068 A1 | 9/2005 | Ishii et al. |
| 2005/0231703 A1 | 10/2005 | Kobayashi |
| 2005/0270515 A1 | 12/2005 | Troost et al. |
| 2005/0281516 A1 | 12/2005 | Okazaki et al. |
| 2006/0050261 A1 | 3/2006 | Brotsack |
| 2006/0114446 A1 | 6/2006 | Gui |
| 2006/0175556 A1 | 8/2006 | Yabuki |
| 2006/0176452 A1 | 8/2006 | Kim et al. |
| 2006/0232841 A1 | 10/2006 | Toishi et al. |
| 2006/0245033 A1 | 11/2006 | Baba-Ali et al. |
| 2007/0146676 A1 | 6/2007 | Tanitsu et al. |
| 2007/0201338 A1 | 8/2007 | Yaoita et al. |
| 2007/0273852 A1 | 11/2007 | Arai |
| 2008/0021948 A1* | 1/2008 | Wilson et al. ............. 708/816 |
| 2008/0239268 A1 | 10/2008 | Mulder et al. |
| 2009/0021656 A1 | 1/2009 | Ozaki |
| 2009/0033902 A1 | 2/2009 | Mulder et al. |
| 2009/0073411 A1 | 3/2009 | Tanitsu |
| 2009/0091730 A1 | 4/2009 | Tanaka |
| 2009/0097007 A1 | 4/2009 | Tanaka |
| 2009/0097094 A1 | 4/2009 | Tanaka |
| 2009/0109417 A1 | 4/2009 | Tanitsu |
| 2009/0128886 A1 | 5/2009 | Hirota |
| 2009/0174877 A1 | 7/2009 | Mulder et al. |
| 2010/0195077 A1 | 8/2010 | Koehler et al. |
| 2012/0202157 A1 | 8/2012 | Tanitsu |
| 2012/0236284 A1 | 9/2012 | Tanaka |

FOREIGN PATENT DOCUMENTS

| | | |
|---|---|---|
| CN | 1601322 A | 3/2005 |
| CN | 1879062 A | 12/2006 |
| DE | 206 607 | 2/1984 |
| DE | 221 563 A1 | 4/1985 |
| DE | 224 448 A1 | 7/1985 |
| DE | 242 880 A1 | 2/1987 |
| DE | 196 35 792 A1 | 4/1997 |
| DE | 100 29 938 A1 | 7/2001 |
| DE | 103 43 333 A1 | 4/2005 |
| EP | 0 023 231 A1 | 2/1981 |
| EP | 0 208 552 A2 | 1/1987 |
| EP | 0 656 555 A1 | 6/1995 |
| EP | 0 764 858 A2 | 3/1997 |
| EP | 0 779 530 A1 | 6/1997 |
| EP | 1109067 A2 | 6/2001 |
| EP | 1 211 561 A2 | 6/2002 |
| EP | 1 262 836 A1 | 12/2002 |
| EP | 1 280 007 A2 | 1/2003 |
| EP | 1 395 049 A1 | 3/2004 |
| EP | 1 489 462 A2 | 12/2004 |
| EP | 1 674 935 A2 | 6/2006 |
| EP | 1 798 758 A1 | 6/2007 |
| EP | 1 882 895 A1 | 1/2008 |
| EP | 1 993 120 A1 | 11/2008 |
| FR | 2 474 708 | 7/1981 |
| JP | A-44-4993 | 2/1969 |
| JP | A-56-6666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |

| | | | | | |
|---|---|---|---|---|---|
| JP | A-1-255404 | 10/1989 | JP | A-5-319774 | 12/1993 |
| JP | A-1-258550 | 10/1989 | JP | A-5-323583 | 12/1993 |
| JP | A-1-276043 | 11/1989 | JP | A-5-326370 | 12/1993 |
| JP | A-1-278240 | 11/1989 | JP | A-6-29204 | 2/1994 |
| JP | A-1-286478 | 11/1989 | JP | A-6-42918 | 2/1994 |
| JP | A-1-292343 | 11/1989 | JP | A-6-53120 | 2/1994 |
| JP | A-1-314247 | 12/1989 | JP | A-6-97269 | 4/1994 |
| JP | A-1-319964 | 12/1989 | JP | A-6-104167 | 4/1994 |
| JP | A-2-42382 | 2/1990 | JP | A-6-120110 | 4/1994 |
| JP | A-2-65149 | 3/1990 | JP | B2-6-29102 | 4/1994 |
| JP | A-2-65222 | 3/1990 | JP | A-6-36054 | 5/1994 |
| JP | A-2-97239 | 4/1990 | JP | A-6-124126 | 5/1994 |
| JP | A-2-106917 | 4/1990 | JP | A-6-124872 | 5/1994 |
| JP | A-2-116115 | 4/1990 | JP | A-6-124873 | 5/1994 |
| JP | A-2-139146 | 5/1990 | JP | A-6-140306 | 5/1994 |
| JP | A-2-166717 | 6/1990 | JP | A-6-148399 | 5/1994 |
| JP | A-2-261073 | 10/1990 | JP | A-6-163350 | 6/1994 |
| JP | A-2-264901 | 10/1990 | JP | A-6-168866 | 6/1994 |
| JP | A-2-285320 | 11/1990 | JP | A-6-177007 | 6/1994 |
| JP | A-2-287308 | 11/1990 | JP | A-6-181157 | 6/1994 |
| JP | A-2-298431 | 12/1990 | JP | A-6-186025 | 7/1994 |
| JP | A-2-311237 | 12/1990 | JP | A-6-188169 | 7/1994 |
| JP | A-3-41399 | 2/1991 | JP | A-6-196388 | 7/1994 |
| JP | A-3-64811 | 3/1991 | JP | A-6-204113 | 7/1994 |
| JP | A-3-72298 | 3/1991 | JP | A-6-204121 | 7/1994 |
| JP | A-3-94445 | 4/1991 | JP | A-6-229741 | 8/1994 |
| JP | A-3-132663 | 6/1991 | JP | A-6-241720 | 9/1994 |
| JP | A-3-134341 | 6/1991 | JP | A-6-244082 | 9/1994 |
| JP | A-3-167419 | 7/1991 | JP | A-6-267825 | 9/1994 |
| JP | A-3-168640 | 7/1991 | JP | A-6-283403 | 10/1994 |
| JP | A-3-211812 | 9/1991 | JP | A-06-291023 | 10/1994 |
| JP | A-3-263810 | 11/1991 | JP | A-6-310399 | 11/1994 |
| JP | A-4-11613 | 1/1992 | JP | A-6-325894 | 11/1994 |
| JP | A-4-32154 | 2/1992 | JP | A-6-326174 | 11/1994 |
| JP | A-4-065603 | 3/1992 | JP | A-6-349701 | 12/1994 |
| JP | A-4-96315 | 3/1992 | JP | A-7-69621 | 3/1995 |
| JP | A-4-101148 | 4/1992 | JP | A-7-92424 | 4/1995 |
| JP | A-4-130710 | 5/1992 | JP | A-7-122469 | 5/1995 |
| JP | A-4-132909 | 5/1992 | JP | A-7-132262 | 5/1995 |
| JP | A-4-133414 | 5/1992 | JP | A-7-134955 | 5/1995 |
| JP | A-4-152512 | 5/1992 | JP | A-7-135158 | 5/1995 |
| JP | A-4-179115 | 6/1992 | JP | A-7-135165 | 5/1995 |
| JP | A-4-186244 | 7/1992 | JP | A-7-147223 | 6/1995 |
| JP | U-4-80052 | 7/1992 | JP | A-7-167998 | 7/1995 |
| JP | A-4-211110 | 8/1992 | JP | A-7-168286 | 7/1995 |
| JP | A-4-225357 | 8/1992 | JP | A-7-174974 | 7/1995 |
| JP | A-4-235558 | 8/1992 | JP | A-7-176468 | 7/1995 |
| JP | A-4-265805 | 9/1992 | JP | A-7-183201 | 7/1995 |
| JP | A-4-273245 | 9/1992 | JP | A-7-183214 | 7/1995 |
| JP | A-4-273427 | 9/1992 | JP | A-7-190741 | 7/1995 |
| JP | A-4-280619 | 10/1992 | JP | A-7-201723 | 8/1995 |
| JP | A-4-282539 | 10/1992 | JP | A-7-220989 | 8/1995 |
| JP | A-4-296092 | 10/1992 | JP | A-7-220990 | 8/1995 |
| JP | A-4-297030 | 10/1992 | JP | A-7-220995 | 8/1995 |
| JP | A-4-305915 | 10/1992 | JP | A-7-221010 | 8/1995 |
| JP | A-4-305917 | 10/1992 | JP | A-7-239212 | 9/1995 |
| JP | U-4-117212 | 10/1992 | JP | A-7-243814 | 9/1995 |
| JP | A-4-330961 | 11/1992 | JP | A-7-245258 | 9/1995 |
| JP | A-4-343307 | 11/1992 | JP | A-7-263315 | 10/1995 |
| JP | A-4-350925 | 12/1992 | JP | A-7-283119 | 10/1995 |
| JP | A 05-013292 | 1/1993 | JP | A-7-297272 | 11/1995 |
| JP | A-5-21314 | 1/1993 | JP | A-7-307268 | 11/1995 |
| JP | A-5-45886 | 2/1993 | JP | A-7-318847 | 12/1995 |
| JP | A-5-62877 | 3/1993 | JP | A-7-335748 | 12/1995 |
| JP | A-5-90128 | 4/1993 | JP | A-8-10971 | 1/1996 |
| JP | A-5-109601 | 4/1993 | JP | A-8-17709 | 1/1996 |
| JP | A-5-127086 | 5/1993 | JP | A-8-22948 | 1/1996 |
| JP | A-5-129184 | 5/1993 | JP | A-8-37149 | 2/1996 |
| JP | A-5-134230 | 5/1993 | JP | A-8-37227 | 2/1996 |
| JP | A-5-160002 | 6/1993 | JP | A-8-46751 | 2/1996 |
| JP | A-5-175098 | 7/1993 | JP | A-8-63231 | 3/1996 |
| JP | A-5-199680 | 8/1993 | JP | A-8-115868 | 5/1996 |
| JP | A-5-217837 | 8/1993 | JP | A-8-136475 | 5/1996 |
| JP | A-5-217840 | 8/1993 | JP | A-8-151220 | 6/1996 |
| JP | A-5-241324 | 9/1993 | JP | A-8-162397 | 6/1996 |
| JP | A-5-243364 | 9/1993 | JP | A-8-166475 | 6/1996 |
| JP | A-5-259069 | 10/1993 | JP | A-8-171054 | 7/1996 |
| JP | A-5-283317 | 10/1993 | JP | A-8-195375 | 7/1996 |
| JP | A-5-304072 | 11/1993 | JP | A-8-203803 | 8/1996 |

| | | | | | |
|---|---|---|---|---|---|
| JP | A-8-279549 | 10/1996 | JP | A-11-54426 | 2/1999 |
| JP | A-8-288213 | 11/1996 | JP | A-11-74185 | 3/1999 |
| JP | A-8-297699 | 11/1996 | JP | A-11-87237 | 3/1999 |
| JP | A-8-316125 | 11/1996 | JP | A-11-111601 | 4/1999 |
| JP | A-8-316133 | 11/1996 | JP | A-11-111818 | 4/1999 |
| JP | A-8-330224 | 12/1996 | JP | A-11-111819 | 4/1999 |
| JP | A-8-334695 | 12/1996 | JP | A-11-121328 | 4/1999 |
| JP | A-8-335552 | 12/1996 | JP | A-11-135400 | 5/1999 |
| JP | A-9-7933 | 1/1997 | JP | A-11-142556 | 5/1999 |
| JP | A-9-15834 | 1/1997 | JP | A-11-150062 | 6/1999 |
| JP | A-9-22121 | 1/1997 | JP | A-11-159571 | 6/1999 |
| JP | A-9-61686 | 3/1997 | JP | A-11-162831 | 6/1999 |
| JP | A-9-82626 | 3/1997 | JP | A-11-163103 | 6/1999 |
| JP | A-9-83877 | 3/1997 | JP | A-11-164543 | 6/1999 |
| JP | A-9-92593 | 4/1997 | JP | A-11-166990 | 6/1999 |
| JP | A-9-108551 | 4/1997 | JP | A-11-98 | 7/1999 |
| JP | A-9-115794 | 5/1997 | JP | A-11-176727 | 7/1999 |
| JP | A-9-134870 | 5/1997 | JP | A-11-176744 | 7/1999 |
| JP | A-9-148406 | 6/1997 | JP | A-11-195602 | 7/1999 |
| JP | A-9-151658 | 6/1997 | JP | A-11-204390 | 7/1999 |
| JP | A-9-160004 | 6/1997 | JP | A-11-218466 | 8/1999 |
| JP | A-9-160219 | 6/1997 | JP | A-11-219882 | 8/1999 |
| JP | A-9-162106 | 6/1997 | JP | A-11-233434 | 8/1999 |
| JP | A-9-178415 | 7/1997 | JP | A-11-238680 | 8/1999 |
| JP | A-9-184787 | 7/1997 | JP | A-11-239758 | 9/1999 |
| JP | A-9-184918 | 7/1997 | JP | A-11-260686 | 9/1999 |
| JP | A-9-186082 | 7/1997 | JP | A-11-260791 | 9/1999 |
| JP | A-9-190969 | 7/1997 | JP | A-11-264756 | 9/1999 |
| JP | A-9-213129 | 8/1997 | JP | A-11-283903 | 10/1999 |
| JP | A-9-219358 | 8/1997 | JP | A-11-288879 | 10/1999 |
| JP | A-9-215208 | 9/1997 | JP | A-11-307610 | 11/1999 |
| JP | A-9-227294 | 9/1997 | JP | A-11-312631 | 11/1999 |
| JP | A-9-232213 | 9/1997 | JP | A-11-354624 | 12/1999 |
| JP | A-9-243892 | 9/1997 | JP | A-2000-3874 | 1/2000 |
| JP | A-9-246672 | 9/1997 | JP | A-2000-12453 | 1/2000 |
| JP | A-9-281077 | 10/1997 | JP | A-2000-21742 | 1/2000 |
| JP | A-9-325255 | 12/1997 | JP | A-2000-21748 | 1/2000 |
| JP | A-9-326338 | 12/1997 | JP | A-2000-29202 | 1/2000 |
| JP | A-10-002865 | 1/1998 | JP | A-2000-32403 | 1/2000 |
| JP | A-10-3039 | 1/1998 | JP | A-2000-36449 | 2/2000 |
| JP | A-10-20195 | 1/1998 | JP | A-2000-58436 | 2/2000 |
| JP | A-10-32160 | 2/1998 | JP | A-2000-81320 | 3/2000 |
| JP | A-10-38517 | 2/1998 | JP | A-2000-92815 | 3/2000 |
| JP | A-10-38812 | 2/1998 | JP | 2000-121498 A | 4/2000 |
| JP | A-10-55713 | 2/1998 | JP | A-2000-97616 | 4/2000 |
| JP | 10-503300 A | 3/1998 | JP | A-2000-106340 | 4/2000 |
| JP | A-10-62305 | 3/1998 | JP | A-2000-114157 | 4/2000 |
| JP | A-10-64790 | 3/1998 | JP | A-2000-121491 | 4/2000 |
| JP | A-10-79337 | 3/1998 | JP | A-2000-147346 | 5/2000 |
| JP | A-10-82611 | 3/1998 | JP | A-2000-154251 | 6/2000 |
| JP | A-10-92735 | 4/1998 | JP | A-2000-180371 | 6/2000 |
| JP | A-10-97969 | 4/1998 | JP | A-2000-206279 | 7/2000 |
| JP | A-10-104427 | 4/1998 | JP | A-2000-208407 | 7/2000 |
| JP | A-10-116760 | 5/1998 | JP | A-2000-240717 | 9/2000 |
| JP | A-10-116778 | 5/1998 | JP | A-2000-243684 | 9/2000 |
| JP | A-10-135099 | 5/1998 | JP | A-2000-252201 | 9/2000 |
| JP | A-H10-116779 | 5/1998 | JP | A-2000-283889 | 10/2000 |
| JP | A-H10-125572 | 5/1998 | JP | A-2000-286176 | 10/2000 |
| JP | A-H10-134028 | 5/1998 | JP | A-2000-311853 | 11/2000 |
| JP | A-10-163099 | 6/1998 | JP | A-2000-323403 | 11/2000 |
| JP | A-10-163302 | 6/1998 | JP | A-2001-7015 | 1/2001 |
| JP | A-10-169249 | 6/1998 | JP | A-2001-20951 | 1/2001 |
| JP | A-10-189427 | 7/1998 | JP | A-2001-23996 | 1/2001 |
| JP | A-10-189700 | 7/1998 | JP | A-2001-37201 | 2/2001 |
| JP | A-10-206714 | 8/1998 | JP | A-2001-44097 | 2/2001 |
| JP | A-10-208993 | 8/1998 | JP | A-2001-74240 | 3/2001 |
| JP | A-10-209018 | 8/1998 | JP | A-2001-83472 | 3/2001 |
| JP | A-10-214783 | 8/1998 | JP | A-2001-85307 | 3/2001 |
| JP | A-10-228661 | 8/1998 | JP | A-2001-97734 | 4/2001 |
| JP | A-10-255319 | 9/1998 | JP | A-2001-110707 | 4/2001 |
| JP | A-10-294268 | 11/1998 | JP | A-2001-118773 | 4/2001 |
| JP | A-10-303114 | 11/1998 | JP | A-2001-135560 | 5/2001 |
| JP | A-10-340846 | 12/1998 | JP | A-2001-144004 | 5/2001 |
| JP | A-11-3849 | 1/1999 | JP | A-2001-167996 | 6/2001 |
| JP | A-11-3856 | 1/1999 | JP | A-2001-176766 | 6/2001 |
| JP | A-11-8194 | 1/1999 | JP | A-2001-203140 | 7/2001 |
| JP | A-11-14876 | 1/1999 | JP | A-2001-218497 | 8/2001 |
| JP | A-11-16816 | 1/1999 | JP | A-2001-228401 | 8/2001 |
| JP | A-11-40657 | 2/1999 | JP | A-2001-228404 | 8/2001 |

| | | | | | | |
|---|---|---|---|---|---|---|
| JP | A-2001-230323 | 8/2001 | | JP | A-2003-124095 | 4/2003 |
| JP | A-2001-242269 | 9/2001 | | JP | A-2003-130132 | 5/2003 |
| JP | A-2001-265581 | 9/2001 | | JP | A-2003-149363 | 5/2003 |
| JP | A-2001-267227 | 9/2001 | | JP | A-2003-151880 | 5/2003 |
| JP | A-2001-272764 | 10/2001 | | JP | A-2003-161882 | 6/2003 |
| JP | A-2001-274083 | 10/2001 | | JP | A-2003-163158 | 6/2003 |
| JP | A-2001-282526 | 10/2001 | | JP | A-2003-166856 | 6/2003 |
| JP | A-2001-296105 | 10/2001 | | JP | A2003-173957 | 6/2003 |
| JP | A-2001-297976 | 10/2001 | | JP | A-2003-188087 | 7/2003 |
| JP | A-2001-304332 | 10/2001 | | JP | A 2003-195223 | 7/2003 |
| JP | A-2001-307982 | 11/2001 | | JP | A-2003-224961 | 8/2003 |
| JP | A-2001-307983 | 11/2001 | | JP | A-2003-229347 | 8/2003 |
| JP | A-2001-313250 | 11/2001 | | JP | A-2003-233001 | 8/2003 |
| JP | A-2001-338868 | 12/2001 | | JP | A-2003-238577 | 8/2003 |
| JP | A-2001-345262 | 12/2001 | | JP | A-2003-240906 | 8/2003 |
| JP | A-2002-14005 | 1/2002 | | JP | A-2003-249443 | 9/2003 |
| JP | A-2002-15978 | 1/2002 | | JP | A-2003-258071 | 9/2003 |
| JP | A-2002-16124 | 1/2002 | | JP | A-2003-262501 | 9/2003 |
| JP | A-2002-43213 | 2/2002 | | JP | A-2003-263119 | 9/2003 |
| JP | A-2002-57097 | 2/2002 | | JP | A-2003-272837 | 9/2003 |
| JP | A-2002-66428 | 3/2002 | | JP | A-2003-273338 | 9/2003 |
| JP | A-2002-71513 | 3/2002 | | JP | A 2003-279889 | 10/2003 |
| JP | A-2002-75816 | 3/2002 | | JP | A-2003-282423 | 10/2003 |
| JP | A-2002-91922 | 3/2002 | | JP | A-2003-297727 | 10/2003 |
| JP | A-2002-93686 | 3/2002 | | JP | A-2003-532218 | 10/2003 |
| JP | A-2002-93690 | 3/2002 | | JP | A-2003-532282 | 10/2003 |
| JP | A-2002-100561 | 4/2002 | | JP | A-2003-311923 | 11/2003 |
| JP | A-2002-118058 | 4/2002 | | JP | A 2004-006440 | 1/2004 |
| JP | A-2002-141270 | 5/2002 | | JP | A-2004-7417 | 1/2004 |
| JP | A-2002-158157 | 5/2002 | | JP | A-2004-14642 | 1/2004 |
| JP | A-2002-170495 | 6/2002 | | JP | A-2004-14876 | 1/2004 |
| JP | A-2002-190438 | 7/2002 | | JP | A-2004-15187 | 1/2004 |
| JP | A-2002-195912 | 7/2002 | | JP | A-2004-22708 | 1/2004 |
| JP | A-2002-198284 | 7/2002 | | JP | A-2004-38247 | 2/2004 |
| JP | A-2002-202221 | 7/2002 | | JP | A-2004-39952 | 2/2004 |
| JP | A-2002-203763 | 7/2002 | | JP | A-2004-40039 | 2/2004 |
| JP | A-2002-208562 | 7/2002 | | JP | A-2004-45063 | 2/2004 |
| JP | A-2002-520810 | 7/2002 | | JP | A-2004-63847 | 2/2004 |
| JP | A-2002-222754 | 8/2002 | | JP | 2004-78136 A | 3/2004 |
| JP | A-2002-227924 | 8/2002 | | JP | A-2004-71851 | 3/2004 |
| JP | A-2002-231619 | 8/2002 | | JP | A-2004-85612 | 3/2004 |
| JP | A-2002-258487 | 9/2002 | | JP | A-2004-87987 | 3/2004 |
| JP | A-2002-261004 | 9/2002 | | JP | A 2004-093624 | 3/2004 |
| JP | A-2002-263553 | 9/2002 | | JP | A-2004-95653 | 3/2004 |
| JP | A-2002-277742 | 9/2002 | | JP | U-3102327 | 3/2004 |
| JP | A-2002-289505 | 10/2002 | | JP | A-2004-98012 | 4/2004 |
| JP | A-2002-305140 | 10/2002 | | JP | A-2004-101362 | 4/2004 |
| JP | A-2002-323658 | 11/2002 | | JP | A-2004-103674 | 4/2004 |
| JP | A-2002-324743 | 11/2002 | | JP | A-2004-111569 | 4/2004 |
| JP | A-2002-329651 | 11/2002 | | JP | A-2004-119497 | 4/2004 |
| JP | A-2002-334836 | 11/2002 | | JP | A-2004-119717 | 4/2004 |
| JP | 2002-353105 A | 12/2002 | | JP | A-2004-128307 | 4/2004 |
| JP | A-2002-353105 | 12/2002 | | JP | A-2004-134682 | 4/2004 |
| JP | A-2002-357715 | 12/2002 | | JP | A-2004-140145 | 5/2004 |
| JP | A-2002-359174 | 12/2002 | | JP | A-2004-145269 | 5/2004 |
| JP | A-2002-362737 | 12/2002 | | JP | A-2004-146702 | 5/2004 |
| JP | A-2002-365783 | 12/2002 | | JP | A-2004-152705 | 5/2004 |
| JP | A-2002-367523 | 12/2002 | | JP | A-2004-153064 | 5/2004 |
| JP | A-2002-367886 | 12/2002 | | JP | A-2004-153096 | 5/2004 |
| JP | A-2002-373849 | 12/2002 | | JP | A-2004-163555 | 6/2004 |
| JP | 2003-022967 A | 1/2003 | | JP | A-2004-165249 | 6/2004 |
| JP | A-2003-15040 | 1/2003 | | JP | A-2004-165416 | 6/2004 |
| JP | A-2003-17003 | 1/2003 | | JP | A-2004-172471 | 6/2004 |
| JP | A-2003-17404 | 1/2003 | | JP | A-2004-177468 | 6/2004 |
| JP | A-2003-28673 | 1/2003 | | JP | A-2004-179172 | 6/2004 |
| JP | A-2003-35822 | 2/2003 | | JP | A-2004-187401 | 7/2004 |
| JP | A-2003-43223 | 2/2003 | | JP | A-2004-193252 | 7/2004 |
| JP | A-2003-45219 | 2/2003 | | JP | A-2004-193425 | 7/2004 |
| JP | A-2003-45712 | 2/2003 | | JP | A-2004-198748 | 7/2004 |
| JP | A-2003-59286 | 2/2003 | | JP | A-2004-205698 | 7/2004 |
| JP | A-2003-59803 | 2/2003 | | JP | A-2004-207696 | 7/2004 |
| JP | A-2003-59821 | 2/2003 | | JP | A-2004-207711 | 7/2004 |
| JP | A-2003-68600 | 3/2003 | | JP | A-2004-260115 | 7/2004 |
| JP | A-2003-75703 | 3/2003 | | JP | A-2004-221253 | 8/2004 |
| JP | A-2003-81654 | 3/2003 | | JP | A-2004-224421 | 8/2004 |
| JP | A-2003-84445 | 3/2003 | | JP | A-2004-228497 | 8/2004 |
| JP | A-2003-98651 | 4/2003 | | JP | A 2004-233897 | 8/2004 |
| JP | A-2003-100597 | 4/2003 | | JP | A-2004-241666 | 8/2004 |
| JP | A-2003-114387 | 4/2003 | | JP | A-2004-247527 | 9/2004 |

| | | | | | | |
|---|---|---|---|---|---|---|
| JP | A-2004-259828 | 9/2004 | | JP | A-2005-276932 | 10/2005 |
| JP | A-2004-259966 | 9/2004 | | JP | A-2005-303167 | 10/2005 |
| JP | A-2004-259985 | 9/2004 | | JP | A-2005-311020 | 11/2005 |
| JP | A-2004-260043 | 9/2004 | | JP | A-2005-315918 | 11/2005 |
| JP | A-2004-260081 | 9/2004 | | JP | A-2005-340605 | 12/2005 |
| JP | 2004-304135 A | 10/2004 | | JP | A-2005-366813 | 12/2005 |
| JP | A-2004-294202 | 10/2004 | | JP | A 2005-537658 | 12/2005 |
| JP | A-2004-301825 | 10/2004 | | JP | A-2006-1821 | 1/2006 |
| JP | A-2004-302043 | 10/2004 | | JP | A-2006-5197 | 1/2006 |
| JP | A-2004-303808 | 10/2004 | | JP | A 2006-013518 | 1/2006 |
| JP | A-2004-307264 | 11/2004 | | JP | A-2006-17895 | 1/2006 |
| JP | A-2004-307265 | 11/2004 | | JP | A-2006-19702 | 1/2006 |
| JP | A-2004-307266 | 11/2004 | | JP | A-2006-24706 | 1/2006 |
| JP | A-2004-307267 | 11/2004 | | JP | A-2006-24819 | 1/2006 |
| JP | A-2004-319724 | 11/2004 | | JP | 2006-054328 A | 2/2006 |
| JP | A-2004-320017 | 11/2004 | | JP | A-2006-32750 | 2/2006 |
| JP | A-2004-327660 | 11/2004 | | JP | A 2006-032963 | 2/2006 |
| JP | A-2004-335808 | 11/2004 | | JP | A-2006-41302 | 2/2006 |
| JP | A-2004-335864 | 11/2004 | | JP | A-2006-54364 | 2/2006 |
| JP | A-2004-336922 | 11/2004 | | JP | A-2006-73584 | 3/2006 |
| JP | A-2004-342987 | 12/2004 | | JP | A-2006-73951 | 3/2006 |
| JP | A-2004-349645 | 12/2004 | | JP | A-2006-80281 | 3/2006 |
| JP | A-2004-356410 | 12/2004 | | JP | A-2006-86141 | 3/2006 |
| JP | A-2005-5295 | 1/2005 | | JP | A-2006-86442 | 3/2006 |
| JP | A-2005-5395 | 1/2005 | | JP | 2006-113437 A | 4/2006 |
| JP | A-2005-5521 | 1/2005 | | JP | A-2006-100363 | 4/2006 |
| JP | A-2005-11990 | 1/2005 | | JP | A-2006-100686 | 4/2006 |
| JP | A-2005-12228 | 1/2005 | | JP | A-2006-120985 | 5/2006 |
| JP | A 2005-018013 | 1/2005 | | JP | A-2006-128192 | 5/2006 |
| JP | A-2005-19628 | 1/2005 | | JP | A-2006-135165 | 5/2006 |
| JP | A-2005-19864 | 1/2005 | | JP | A 2006-135312 | 5/2006 |
| JP | A-2005-26634 | 1/2005 | | JP | A-2006-140366 | 6/2006 |
| JP | A 2005-503018 | 1/2005 | | JP | A-2006-170811 | 6/2006 |
| JP | A 2005-032909 | 2/2005 | | JP | A-2006-170899 | 6/2006 |
| JP | A-2005-51147 | 2/2005 | | JP | 2006-516724 T | 7/2006 |
| JP | A-2005-55811 | 3/2005 | | JP | A-2006-177865 | 7/2006 |
| JP | A-2005-64210 | 3/2005 | | JP | A-2006-184414 | 7/2006 |
| JP | A-2005-64391 | 3/2005 | | JP | A-2006-194665 | 7/2006 |
| JP | A-2005-79222 | 3/2005 | | JP | A-2006-516724 | 7/2006 |
| JP | A-2005-79584 | 3/2005 | | JP | A 2006-228718 | 8/2006 |
| JP | A-2005-79587 | 3/2005 | | JP | A 2006-519494 | 8/2006 |
| JP | A-2005-86148 | 3/2005 | | JP | A-2006-250587 | 9/2006 |
| JP | A-2005-91023 | 4/2005 | | JP | A-2006-253572 | 9/2006 |
| JP | A-2005-93324 | 4/2005 | | JP | 2006-524349 A | 10/2006 |
| JP | A-2005-93948 | 4/2005 | | JP | A-2006-269762 | 10/2006 |
| JP | A-2005-97057 | 4/2005 | | JP | A-2006-278820 | 10/2006 |
| JP | A-2005-108934 | 4/2005 | | JP | A 2006-284740 | 10/2006 |
| JP | A-2005-114882 | 4/2005 | | JP | A-2006-289684 | 10/2006 |
| JP | A-2005-116570 | 4/2005 | | JP | A 2006-344747 | 12/2006 |
| JP | A-2005-116571 | 4/2005 | | JP | A-2006-349946 | 12/2006 |
| JP | A-2005-116831 | 4/2005 | | JP | A-2006-351586 | 12/2006 |
| JP | A-2005-123586 | 5/2005 | | JP | A-2007-5830 | 1/2007 |
| JP | A-2005-127460 | 5/2005 | | JP | A 2007-019079 | 1/2007 |
| JP | A-2005-136404 | 5/2005 | | JP | A-2007-43980 | 2/2007 |
| JP | A 2005-136422 | 5/2005 | | JP | A-2007-48819 | 2/2007 |
| JP | A-2005-140999 | 6/2005 | | JP | A-2007-51300 | 3/2007 |
| JP | A-2005-150759 | 6/2005 | | JP | A 2007-505488 | 3/2007 |
| JP | A-2005-156592 | 6/2005 | | JP | A-2007-87306 | 4/2007 |
| JP | A-2005-166871 | 6/2005 | | JP | A-2007-93546 | 4/2007 |
| JP | A-2005-175176 | 6/2005 | | JP | A-2007-103153 | 4/2007 |
| JP | A-2005-175177 | 6/2005 | | JP | A-2007-113939 | 5/2007 |
| JP | A-2005-191344 | 7/2005 | | JP | A-2007-119851 | 5/2007 |
| JP | A-2005-203483 | 7/2005 | | JP | A-2007-120333 | 5/2007 |
| JP | 2005-223328 A2 | 8/2005 | | JP | A-2007-120334 | 5/2007 |
| JP | A-2005-209705 | 8/2005 | | JP | A-2007-142313 | 6/2007 |
| JP | A-2005-209706 | 8/2005 | | JP | A-2007-144864 | 6/2007 |
| JP | A-2005-233979 | 9/2005 | | JP | A 2007-150295 | 6/2007 |
| JP | A-2005-234359 | 9/2005 | | JP | A-2007-170938 | 7/2007 |
| JP | A-2005-236088 | 9/2005 | | JP | A-2007-187649 | 7/2007 |
| JP | A-2005-243770 | 9/2005 | | JP | A-2007-207821 | 8/2007 |
| JP | A 2005-243870 | 9/2005 | | JP | A-2007-227637 | 9/2007 |
| JP | A-2005-243904 | 9/2005 | | JP | A 2007-227918 | 9/2007 |
| JP | A-2005-251549 | 9/2005 | | JP | A-2007-235041 | 9/2007 |
| JP | A-2005-257740 | 9/2005 | | JP | A 2007-258691 | 10/2007 |
| JP | A-2005-259789 | 9/2005 | | JP | A-2007-274881 | 10/2007 |
| JP | A-2005-259830 | 9/2005 | | JP | A-2007-280623 | 10/2007 |
| JP | A-2005-268700 | 9/2005 | | JP | A-2007-295702 | 11/2007 |
| JP | A-2005-268741 | 9/2005 | | JP | A-2008-3740 | 1/2008 |
| JP | A-2005-268742 | 9/2005 | | JP | A 2008-047744 | 2/2008 |

| | | |
|---|---|---|
| JP | A-2008-58580 | 3/2008 |
| JP | A-2008-64924 | 3/2008 |
| JP | 2008-102134 A | 5/2008 |
| JP | A-2008-103737 | 5/2008 |
| JP | A-2008-180492 | 8/2008 |
| JP | A 2008-258605 | 10/2008 |
| JP | A-2009-17540 | 1/2009 |
| JP | A-2009-60339 | 3/2009 |
| JP | A 2009-105396 | 5/2009 |
| JP | A 2009-111369 | 5/2009 |
| JP | A 2009-117801 | 5/2009 |
| JP | A 2009-117812 | 5/2009 |
| JP | A 2010-034486 | 2/2010 |
| WO | WO 97/11411 A1 | 3/1997 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 A1 | 9/1999 |
| WO | WO 99/49504 A1 | 9/1999 |
| WO | WO 99/50712 A1 | 10/1999 |
| WO | WO 99/66370 A1 | 12/1999 |
| WO | WO 00/11706 A1 | 3/2000 |
| WO | WO 00/67303 | 4/2000 |
| WO | WO 00/67303 A1 | 11/2000 |
| WO | WO 01/03170 A1 | 1/2001 |
| WO | WO 01/10137 A1 | 2/2001 |
| WO | WO 01/22480 A1 | 3/2001 |
| WO | WO 01/27978 A1 | 4/2001 |
| WO | WO 01/59502 A1 | 8/2001 |
| WO | WO 01/65296 A1 | 9/2001 |
| WO | WO 02/16993 A1 | 2/2002 |
| WO | WO 02/063664 A1 | 8/2002 |
| WO | WO 02/069049 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/101804 A1 | 12/2002 |
| WO | WO 02/103766 A1 | 12/2002 |
| WO | WO 03/023832 A1 | 3/2003 |
| WO | WO 03/023833 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051717 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/071070 A2 | 8/2004 |
| WO | WO 2004/077164 A1 | 9/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |
| WO | WO 2005/008754 A1 | 1/2005 |
| WO | WO 2005/022615 A1 | 3/2005 |
| WO | WO 2005/026843 A2 | 3/2005 |
| WO | WO 2005/029559 A1 | 3/2005 |
| WO | WO 2005/036619 A1 | 4/2005 |
| WO | WO 2005/036620 A1 | 4/2005 |
| WO | WO 2005-036622 A1 | 4/2005 |
| WO | WO 2005-036623 A1 | 4/2005 |
| WO | WO 2005/041276 A1 | 5/2005 |
| WO | WO 2005/048325 A1 | 5/2005 |
| WO | WO 2005/048326 A1 | 5/2005 |
| WO | WO 2005/057636 A1 | 6/2005 |
| WO | WO 2005/067013 A1 | 7/2005 |
| WO | WO 2005/071717 A1 | 8/2005 |
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006-006730 A1 | 1/2006 |
| WO | WO 2006-016551 A1 | 2/2006 |
| WO | WO 2006/019124 A1 | 2/2006 |
| WO | WO 2006-025341 A1 | 3/2006 |
| WO | WO 2006-028188 A1 | 3/2006 |
| WO | WO 2006-030727 A1 | 3/2006 |
| WO | WO 2006/030910 A1 | 3/2006 |
| WO | WO 2006/035775 A1 | 4/2006 |
| WO | WO 2006/049134 A1 | 5/2006 |
| WO | WO 2006/051909 A1 | 5/2006 |
| WO | WO 2006-064851 A1 | 6/2006 |
| WO | WO 2006/068233 A1 | 6/2006 |
| WO | WO 2006/077958 A1 | 7/2006 |
| WO | WO 2006/080285 A1 | 8/2006 |
| WO | WO 2006/085524 A1 | 8/2006 |
| WO | WO 2006/085626 A1 | 8/2006 |
| WO | WO 2006/100889 A1 | 9/2006 |
| WO | WO 2006-118108 A1 | 11/2006 |
| WO | WO 2007/003563 A1 | 1/2007 |
| WO | WO 2007/004567 A1 | 1/2007 |
| WO | WO 2007-018127 A1 | 2/2007 |
| WO | WO 2007/055237 A1 | 5/2007 |
| WO | WO 2007/055373 A1 | 5/2007 |
| WO | WO 2007/058188 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/100081 A1 | 9/2007 |
| WO | WO 2007/132862 A1 | 11/2007 |
| WO | WO 2007/141997 A1 | 12/2007 |
| WO | WO 2008/015973 A1 | 2/2008 |
| WO | WO 2008/041575 A1 | 4/2008 |
| WO | WO 2008/059748 A1 | 5/2008 |
| WO | WO 2008/061681 A2 | 5/2008 |
| WO | WO 2006-343023 | 6/2008 |
| WO | WO 2008/065977 A1 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/139848 A1 | 11/2008 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Office Action dated Jun. 30, 2011 in Chinese Patent Application No. 200880021453.5.
Office Action dated Jul. 28, 2011 in U.S. Appl. No. 12/252,283.
Office Action dated Jul. 19, 2011 in U.S. Appl. No. 12/191,821.
Office Action dated Jul. 26, 2011 in Chinese Patent Application No. 200880020867.6.
Office Action dated Jul. 12, 2011 in Chinese Patent Application No. 200880018312.8.
Dec. 20, 2011 Office Action issued in CN Application No. 200980101546.3 (with English translation).
Dec. 15, 2011 Notice of Allowance issued in U.S. Appl. No. 12/245,021.
Office Action dated Nov. 7, 2011 in U.S. Appl. No. 12/250,519.
Office Action dated Nov. 15, 2011 in U.S. Appl. No. 12/252,274.
Office Action dated Dec. 8, 2011 in U.S. Appl. No. 12/256,055.
Office Action dated Nov. 3, 2011 in Chinese Patent Application No. 200880015567.9.
Office Action dated Dec. 12, 2011 in European Patent Application No. 08 837 064.8.

Office Action dated Nov. 17, 2011 in Chinese Patent Application No. 200880024375.4.
Feb. 7, 2012 Notice of Allowance issued in U.S. Appl. No. 12/191,821.
Feb. 24, 2012 Notice of Allowance issued in U.S. Appl. No. 12/252,283.
Aug. 26, 2011 Office Action issued in U.S. Appl. No. 12/245,021.
Search Report issued Sep. 21, 2012 in European Patent Application No. 12173801.7.
Notice of Allowance issued Oct. 23, 2012 in Japanese Patent Application No. P2008-263405 (with translation).
Notice of Reasons for Rejection issued Nov. 20, 2012 in Japanese Application No. P2008261214 (with translation).
Notice of Reasons for Rejection issued Nov. 20, 2012 in Japanese Application No. P2008261215 (with translation).
Notice of Allowance issued Nov. 27, 2012 in U.S. Appl. No. 12/252,274.
Feb. 22, 2012 Office Action issued in Chinese Patent Application No. 200880020867.6 (with translation).
May 9, 2012 Office Action issued in European Patent Application No. 08830323.5.
May 29, 2012 Office Action issued in U.S. Appl. No. 13/417,602.
May 23, 2012 Notice of Allowance issued in U.S. Appl. No. 12/191,821.
Jun. 20, 2012 Office Action issued in Chinese Patent Application No. 200880100940.0 (with translation).
Jul. 17, 2012 Office Action issued in U.S. Appl. No. 12/250,519.
Jul. 27, 2012 Search Report issued in European Patent Application No. 12171299.6.
Jun. 18, 2012 Office Action issued in Chinese patent application No. 200880021453.5 (with translation).
Aug. 14, 2012 Notice of Allowance issued in U.S. Appl. No. 12/252,274.
Jul. 26, 2012 Office Action issued in Chinese Patent Application No. 200880020867.6 (with translation).
Aug. 27, 2012 Final Office Action issued in U.S. Appl. No. 12/256,055.
Aug. 24, 2012 Notice of Allowance issued in U.S. Appl. No. 12/245,021.
Office Action issued Sep. 14, 2012 in U.S. Appl. No. 13/484,051.
Notice of Allowance issued Sep. 28, 2012 in U.S. Appl. No. 12/252,283.
Search Report issued Oct. 2, 2012 in European Patent Application No. 12173803.3.
Office Action issued Oct. 17, 2012 in European Patent Application No. 08 841 021.2.
Office Action issued Oct. 17, 2012 in European Patent Application No. 09 015 716.5.
Search Report issued Oct. 18, 2012 in European Patent Application No. 09015718.1.
Office Action issued Oct. 10, 2012 in Chinese Patent Application No. 200880015567.9 (with English-language translation).
Search Report issued Oct. 30, 2012 in European Patent Application No. 12173802.5.
Jan. 15, 2009 International Search Report issued in International Application No. PCT/JP2008/068319.
Mar. 25, 2009 International Search Report issued in International Application No. PCT/JP2008/066803.
Jan. 16, 2009 Invitation to Pay Additional Fees Relating to the results of the Partial International Search Report issued in International Application No. PCT/JP2008/066803.
May 25, 2009 International Search Report issued in International Application No. PCT/JP2008/069704.
Mar. 6, 2009 Invitation to Pay Additional Fees Relating to the results of the Partial International Search Report issued in International Application No. PCT/JP2008/069704.
Jan. 26, 2009 International Search Report issued in International Application No. PCT/JP2008/068909.
Apr. 6, 2009 International Search Report issued in International Application No. PCT/JP2008/070253.
Mar. 2, 2009 International Search Report issued in International Application No. PCT/JP2008/069701.
Dec. 9, 2010 European Search Report issued in European Application No. 09015719.9.
Dec. 9, 2010 European Search Report issued in European Application No. 09015716.5.
Dec. 9, 2010 Partial European Search Report issued in European Application No. 09015718.1.
Oct. 15, 2010 Office Action issued in European Application No. 08 835 135.8.
Feb. 22, 2011 Office Action issued in European Application No. 08 830 323.5.
Dec. 8, 2010 Office Action issued in European Application No. 08 841 021.2.
Jun. 25, 2010 Office Action issued in European Application No. 08 837 064.8.
Mar. 24, 2011 Office Action issued in Chinese Application No. 200880024806.7 (with translation).
Feb. 20, 2012 Second Office Action issued in Chinese Patent Application No. 200880018312.8 (with translation).
May 18, 2011 Office Action issued in U.S. Appl. No. 12/208,155.
Jul. 27, 2011 Office Action issued in U.S. Appl. No. 12/208,155.
Mar. 24, 2011 Office Action issued in U.S. Appl. No. 12/191,821.
Jul. 18, 2011 Office Action issued in U.S. Appl. No. 12/250,519.
Jan. 3, 2011 Office Action issued in U.S. Appl. No. 12/262,930.
Mar. 31, 2011 Notice of Allowance issued in U.S. Appl. No. 12/252,274.
Sep. 1, 2010 Office Action issued in U.S. Appl. No. 12/252,274.
Gao, Yiqing et al., "Research on high-quality projecting reduction lithography system based on digital mask technique", Optik 116, pp. 303-310 (2005).
Office Action issued Dec. 18, 2012 in U.S. Appl. No. 12/250,519.
Office Action issued Dec. 26, 2012 in Chinese Patent Application No. 200980101546.3 (with translation).
Notice of Allowance issued Jan. 15, 2013 in U.S. Appl. No. 12/191,821.
Notice of Allowance issued Jan. 16, 2013 in U.S. Appl. No. 13/417,602.
Notice of Allowance issued Jan. 23, 2013 in U.S. Appl. No. 12/252,283.
Notice of Reasons for Rejection issued Jan. 15, 2013 in Japanese Patent Application No. 2008259522 (with translation).
Office Action issued Jan. 31, 2013 in Chinese Patent Application No. 200880021453.5 (with translation).
Mar. 19, 2013 Office Action issued in European Patent Application No. 08830323.5.
Feb. 19, 2013 Office Action issued in Japanese Patent Application No. P2010-514429 (with translation).
Mar. 11, 2013 Office Action issued in European Patent Application No. 08847031.5.

* cited by examiner

INSPECTION DEVICE AND INSPECTING METHOD FOR SPATIAL LIGHT MODULATOR, ILLUMINATION OPTICAL SYSTEM, METHOD FOR ADJUSTING THE ILLUMINATION OPTICAL SYSTEM, EXPOSURE APPARATUS, AND DEVICE MANUFACTURING METHOD

CROSS-REFERENCE TO RELATED APPLICATIONS

This application is a continuation application of International Application No. PCT/JP2009/058802 filed on May 12, 2009 and claiming the benefit of priorities from Japanese Patent Application No. 2008-138841 filed on May 28, 2008, the entire contents of which are incorporated herein by reference.

BACKGROUND

1. Field

One embodiment of the present invention relates to an inspection device and inspecting method for a spatial light modulator, an illumination optical system, a method for adjusting the illumination optical system, an exposure apparatus, and a device manufacturing method. For example, the embodiment of the present invention relates to inspection of a spatial light modulator suitably applicable to an illumination optical system of an exposure apparatus for manufacturing devices such as semiconductor devices, imaging devices, liquid crystal display devices, and thin film magnetic heads by lithography.

2. Description of the Related Art

In a typical exposure apparatus of this type, a light beam emitted from a light source travels through a fly's eye lens as an optical integrator to form a secondary light source (a predetermined light intensity distribution on an illumination pupil in general) as a substantial surface illuminant consisting of a large number of light sources. The light intensity distribution on the illumination pupil will be referred to hereinafter as a "pupil intensity distribution." The illumination pupil is defined as a position such that an illumination target surface becomes a Fourier transform plane of the illumination pupil by action of an optical system between the illumination pupil and the illumination target surface (a mask or a wafer in the case of the exposure apparatus).

Beams from the secondary light source are condensed by a condenser lens to superposedly illuminate the mask on which a predetermined pattern is formed. Light passing through the mask travels through a projection optical system to be focused on the wafer, whereby the mask pattern is projected (or transferred) onto the wafer to effect exposure thereof. Since the pattern formed on the mask is a highly integrated one, an even illuminance distribution must be obtained on the wafer in order to accurately transfer this microscopic pattern onto the wafer.

There is a hitherto proposed illumination optical system capable of continuously changing the pupil intensity distribution (and, in turn, an illumination condition) without use of a zoom optical system (See Japanese Patent Application Laid-open No. 2002-353105). In the illumination optical system disclosed in Japanese Patent Application Laid-open No. 2002-353105, using a movable multi-mirror composed of a large number of microscopic mirror elements which are arranged in an array form and an inclination angle and inclination direction of each of which are individually driven and controlled, an incident beam is divided in microscopic units by respective reflecting surfaces to be deflected thereby, so as to convert a cross section of the incident beam into a desired shape or desired size and, in turn, so as to realize a desired pupil intensity distribution.

Since the illumination optical system described in Japanese Patent Application Laid-open No. 2002-353105 uses the reflection type spatial light modulator having the large number of microscopic mirror elements whose postures are individually controlled, degrees of freedom are high about change in shape and size of the pupil intensity distribution. However, there is a possibility that, for example, reflectances of reflecting surfaces of the mirror elements made of aluminum will decrease with time because of irradiation with light and it will become difficult to form a desired pupil intensity distribution because of influence of the reflectance decrease.

An embodiment of the present invention has been accomplished in view of the above problem and it is an object of the present invention to provide an inspection device and inspecting method capable of inspecting the reflectances of the mirror elements of the spatial light modulator arranged in the optical path of the illumination optical system, for example, on an as-needed basis. It is another object of the present invention to provide an illumination optical system capable of achieving a desired pupil intensity distribution, using the inspection device for inspecting the reflectances of the mirror elements of the spatial light modulator arranged in the optical path, for example. It is still another object of the present invention to provide an exposure apparatus capable of performing excellent exposure under an appropriate illumination condition, using the illumination optical system achieving the desired pupil intensity distribution.

SUMMARY

An embodiment of the present invention provides an inspection device for inspecting a spatial light modulator having a plurality of optical elements arrayed two-dimensionally and controlled individually, the inspection device comprising:

a conjugate optical system which is arranged optically downstream the spatial light modulator and which forms a conjugate plane optically conjugate with an array plane where the plurality of optical elements are arrayed;

a photodetector having a detection surface arranged on or near the conjugate plane; and an inspection unit which inspects optical characteristics of the plurality of optical elements, based on a result of detection by the photodetector.

A second embodiment of the present invention provides an inspection device for inspecting a spatial light modulator having a plurality of optical elements arrayed two-dimensionally and controlled individually, the inspection device comprising:

a Fourier transform optical system which is arranged optically downstream the spatial light modulator and which forms a Fourier transform plane optically in a Fourier transform relation with an array plane where the plurality of optical elements are arrayed;

a photodetector having a detection surface arranged on or near the Fourier transform plane; and an inspection unit which inspects optical characteristics of the plurality of optical elements, based on a result of detection by the photodetector.

A third embodiment of the present invention provides an inspecting method for inspecting a spatial light modulator having a plurality of optical elements arrayed two-dimensionally and controlled individually, the inspecting method comprising:

inspecting optical characteristics of the plurality of optical elements, based on a light intensity distribution formed on a conjugate plane optically conjugate with an array plane where the plurality of optical elements are arrayed, by light having traveled via the plurality of optical elements.

A fourth embodiment of the present invention provides an inspecting method for inspecting a spatial light modulator having a plurality of optical elements arrayed two-dimensionally and controlled individually, the inspecting method comprising:

inspecting optical characteristics of the plurality of optical elements, based on a light intensity distribution formed on a Fourier transform plane optically in a Fourier transform relation with an array plane where the plurality of optical elements are arrayed, by light having traveled via the plurality of optical elements.

A fifth embodiment of the present invention provides an illumination optical system which comprises a spatial light modulator having a plurality of optical elements arrayed two-dimensionally and controlled individually and which illuminates an illumination target surface on the basis of light from a light source, the illumination optical system comprising:

the inspection device of the first aspect or the second aspect for inspecting the spatial light modulator; and a distribution forming optical system which forms a predetermined light intensity distribution on an illumination pupil of the illumination optical system, based on light having traveled via the spatial light modulator.

A sixth embodiment of the present invention provides a method for adjusting an illumination optical system which comprises a spatial light modulator having a plurality of optical elements arrayed two-dimensionally and controlled individually and which illuminates an illumination target surface on the basis of light from a light source, the method comprising:

inspecting optical characteristics of the plurality of optical elements, using the inspection device of the first aspect or the second aspect or the inspecting method of the third aspect or the fourth aspect; and optically adjusting the illumination optical system, based on a result of inspection in the inspection.

A seventh embodiment of the present invention provides an exposure apparatus comprising the illumination optical system of the fifth aspect for illuminating a predetermined pattern, wherein the predetermined pattern is transferred onto a photosensitive substrate to effect exposure thereof.

An eighth embodiment of the present invention provides a device manufacturing method comprising:

transferring the predetermined pattern onto the photosensitive substrate to effect exposure thereof, using the exposure apparatus of the seventh aspect;

developing the photosensitive substrate on which the predetermined pattern is transferred, to form a mask layer of a shape corresponding to the predetermined pattern on a surface of the photosensitive substrate; and processing the surface of the photosensitive substrate through the mask layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

EXPLANATION

Figure 1:
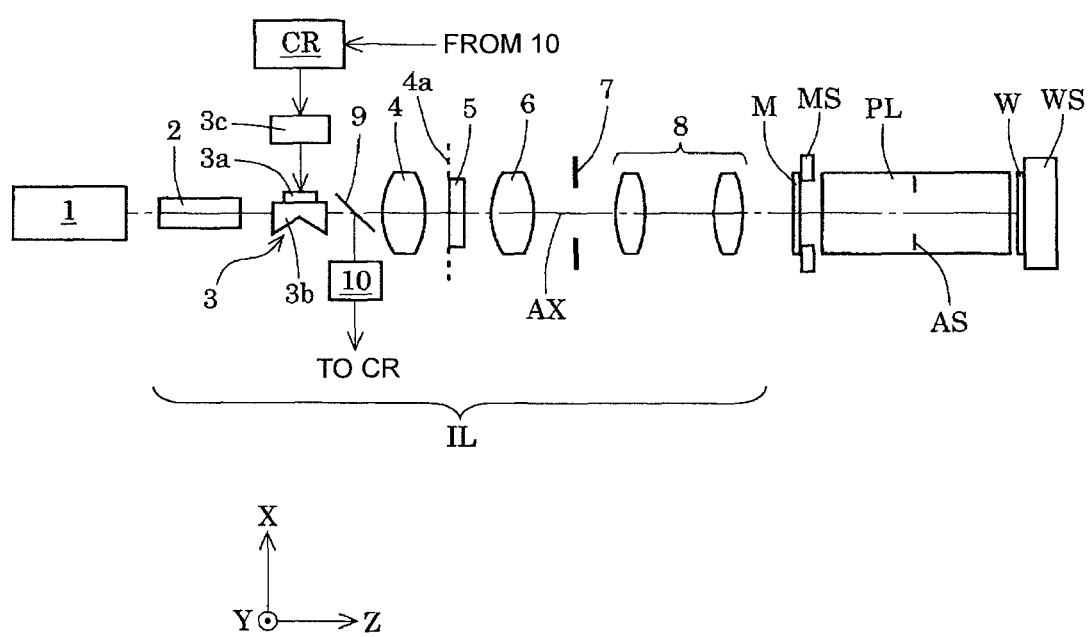
FIG. 1 is a drawing schematically showing an exemplary configuration of an exposure apparatus according to an embodiment of the present invention.

Embodiments of the present invention will be described on the basis of the accompanying drawings. FIG. 1 is a drawing schematically showing a configuration of an exposure apparatus according to an embodiment of the present invention. In FIG. 1, the Z-axis is set along a direction of a normal to an exposed surface of a wafer W being a photosensitive substrate, the X-axis is set along a direction parallel to the plane of FIG. 1 in the exposed surface of the wafer W, and the Y-axis is set along a direction perpendicular to the plane of FIG. 1 in the exposed surface of the wafer W.

Referring to FIG. 1, the exposure apparatus of the present embodiment has a light source 1 supplying illumination light (exposure light), an illumination optical system IL including a spatial light modulating unit 3, a mask stage MS supporting a mask M, a projection optical system PL, and a wafer stage WS supporting the wafer W, along the optical axis AX of the device. The exposure apparatus of the present embodiment is configured to illuminate the mask M with the light from the light source 1 through the illumination optical system IL. Light transmitted by the mask M travels through the projection optical system PL to form an image of a pattern of the mask M on the wafer W.

The illumination optical system IL for illuminating a pattern surface (illumination target surface) of the mask M on the basis of the light from the light source 1 implements modified illumination such as multi-polar illumination (dipolar illumination, quadrupolar illumination, or the like) or annular illumination by action of the spatial light modulating unit 3. The illumination optical system IL has, in order from the light source 1 side along the optical axis AX, a beam sending unit 2, the spatial light modulating unit 3, a zoom optical system 4, a fly's eye lens 5, a condenser optical system 6, an illumination field stop (mask blind) 7, and a field stop imaging optical system 8.

A beam splitter 9 for splitting the illumination light from the spatial light modulating unit 3 is arranged in the optical path between the spatial light modulating unit 3 and the zoom optical system 4 (or in the optical path between the spatial light modulating unit 3 and the optical integrator (fly's eye lens 5)) and the system is configured so that light guided to the outside of the illumination optical path by this beam splitter 9 is incident to an inspection device 10. The configuration and action of the inspection device 10 will be described later.

The spatial light modulating unit 3 forms a desired light intensity distribution (pupil intensity distribution) in its far field region (Fraunhofer diffraction region), based on the light from the light source 1 through the beam sending unit 2. The configuration and action of the spatial light modulating unit 3 will be described later. The beam sending unit 2 has functions to guide an incident beam from the light source 1 to the spatial light modulating unit 3 while converting the incident beam into a beam having a cross section of an appropriate size and shape, and to actively correct variation in position and variation in angle of the beam incident to the spatial light modulating unit 3. The zoom optical system 4 condenses the light from the spatial light modulating unit 3 and guides the condensed light to the fly's eye lens 5.

The fly's eye lens 5 is an optical integrator of a wavefront division type consisting of a large number of lens elements arrayed densely, for example. The fly's eye lens 5 divides the wavefront of the incident beam to form a secondary light source (substantial surface illuminant) consisting of light source images as many as the lens elements, on its rear focal plane. An entrance plane of the fly's eye lens 5 is arranged at or near the rear focus position of the zoom optical system 4. The fly's eye lens 5 to be used herein can be, for example, a cylindrical micro fly's eye lens. The configuration and action of the cylindrical micro fly's eye lens are disclosed, for example, in U.S. Pat. No. 6,913,373.

In the present embodiment, the mask M placed on the illumination target surface of the illumination optical system IL is illuminated by Köhler illumination using the secondary light source formed by the fly's eye lens 5, as a light source. For this, the position where the secondary light source is formed is optically conjugate with a position of an aperture stop AS of the projection optical system PL and a plane where the secondary light source is formed can be called an illumination pupil plane of the illumination optical system IL. Typically, the illumination target surface (the plane where the mask M is placed, or the plane where the wafer W is placed if the illumination optical system is considered to include the projection optical system PL) becomes an optical Fourier transform plane with respect to the illumination pupil plane.

The pupil intensity distribution is a light intensity distribution (luminance distribution) on the illumination pupil plane of the illumination optical system IL or on a plane optically conjugate with the illumination pupil plane. When the number of divisions of the wavefront by the fly's eye lens 5 is relatively large, an overall light intensity distribution formed on the entrance plane of the fly's eye lens 5 demonstrates a high correlation with an overall light intensity distribution (pupil intensity distribution) of the entire secondary light source. For this reason, the light intensity distributions on the entrance plane of the fly's eye lens 5 and on a plane optically conjugate with the entrance plane can also be called pupil intensity distributions.

The condenser optical system 6 condenses the light emitted from the fly's eye lens 5 to illuminate the illumination field stop 7 in a superimposed manner. Light passing through the illumination field stop 7 travels through the field stop imaging optical system 8 to form an illumination region being an image of an aperture of the illumination field stop 7, in at least a part of the pattern forming region on the mask M. FIG. 1 is depicted without installation of path bending mirrors for bending the optical axis (optical path eventually), but it should be noted that it is optional to arrange an appropriate number of path bending mirrors in the illumination optical path as needed.

The mask M is mounted along the XY plane (e.g., a horizontal plane) on the mask stage MS and the wafer W is mounted along the XY plane on the wafer stage WS. The projection optical system PL forms an image of the pattern of the mask M on the exposed surface (projection surface) of the wafer W, based on light from the illumination region formed on the pattern surface of the mask M by the illumination optical system IL. In this manner, the pattern of the mask M is successively transferred onto each of exposure regions on the wafer W by carrying out full-shot exposure or scan exposure while two-dimensionally driving and controlling the wafer stage WS in the plane (XY plane) perpendicular to the optical axis AX of the projection optical system PL and, therefore, while two-dimensionally driving and controlling the wafer W.

Figure 2:
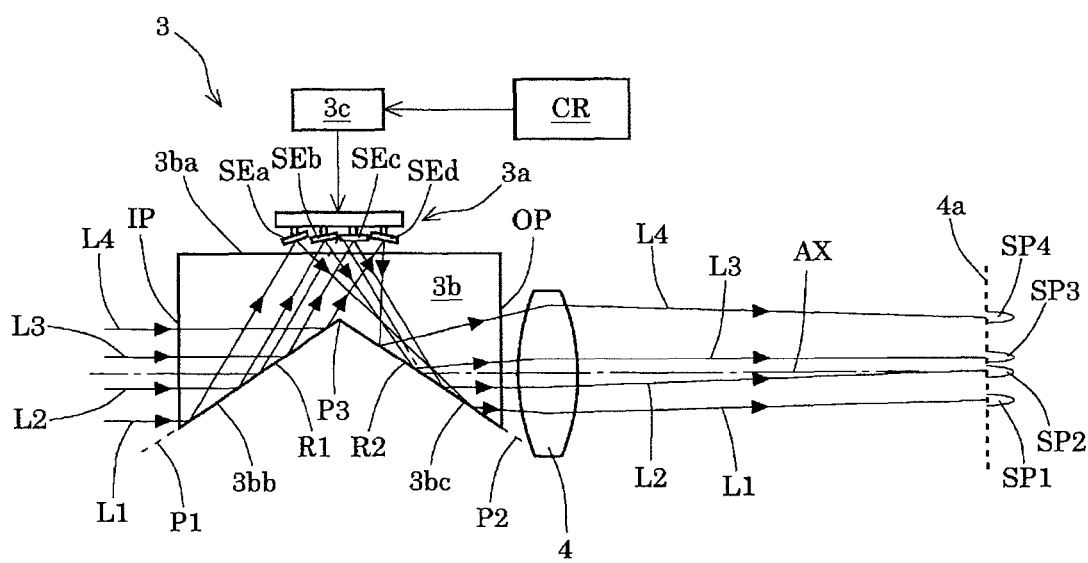
FIG. 2 is a drawing schematically showing an exemplary internal configuration of a spatial light modulating unit.
Figure 2:
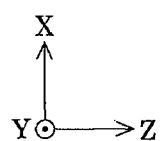
Figure 3:
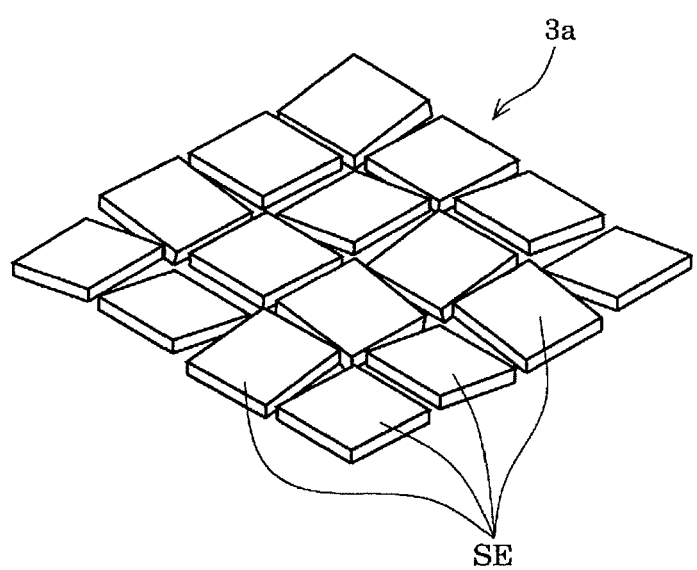
FIG. 3 is a partial perspective view of a spatial light modulator incorporated in the spatial light modulating unit.

The configuration and action of the spatial light modulating unit 3 will be described below with reference to FIGS. 2 and 3. FIG. 2 is a drawing schematically showing an internal configuration of the spatial light modulating unit 3. FIG. 3 is a partial perspective view of spatial light modulator 3a in the spatial light modulating unit 3. For clarity of the drawing, FIG. 2 is depicted without illustration of the beam splitter 9.

The spatial light modulating unit 3, as shown in FIG. 2, has a prism 3b made of an optical material, e.g., like fluorite, and a spatial light modulator 3a of a reflection type installed in proximity to a side face 3ba of the prism 3b parallel to the YZ plane. The optical material making up the prism 3b does not have to be limited to fluorite, but may be quartz or any other optical material depending, for example, upon the wavelength of the light supplied from the light source 1.

The prism 3b has a form obtained by replacing one side face (side face opposed to the side face 3ba to which the spatial light modulator 3a is installed in proximity) of a rectangular parallelepiped with side faces 3bb and 3bc of a V-shaped indentation, and is also called a K prism because of its cross-sectional shape along the XZ plane. The side faces 3bb and 3bc of the V-shaped indentation in the prism 3b are defined by two planes P1 and P2 intersecting at an obtuse angle. The two planes P1 and P2 both are perpendicular to the XZ plane and form a V-shape along the XZ plane.

Internal surfaces of the two side faces 3bb and 3bc in contact with each other on an intersecting line (straight line extending in the Y-direction) P3 between the two planes P1 and P2 function as reflecting surfaces R1 and R2. Namely, the reflecting surface R1 is located on the plane P1, the reflecting surface R2 is located on the plane P2, and the angle between the reflecting surfaces R1 and R2 is an obtuse angle. As an example, the angle between the reflecting surfaces R1 and R2 can be 120°, the angle between an input plane IP of the prism 3b normal to the optical axis AX, and the reflecting surface R1 60°, and the angle between an output plane OP of the prism 3b normal to the optical axis AX, and the reflecting surface R2 60°.

The prism 3b is arranged so that the side face 3ba, to which the spatial light modulator 3a is installed in proximity, is parallel to the optical axis AX and so that the reflecting surface R1 is located on the light source 1 side (upstream in the exposure apparatus: on the left in FIG. 2) and the reflecting surface R2 on the fly's eye lens 5 side (downstream in the exposure apparatus: on the right in FIG. 2). More specifically, the reflecting surface R1 is inclined with respect to the optical axis AX and the reflecting surface R2 is inclined with respect to the optical axis AX in symmetry with the reflecting surface R1 with respect to a plane passing the tangent line P3 and being parallel to the XY plane. The side face 3ba of the prism 3b is an optical surface opposed to the plane where a plurality of mirror elements SE of the spatial light modulator 3a are arrayed, as described below.

The reflecting surface R1 of the prism 3b reflects light incident thereto through the input plane IP, toward the spatial light modulator 3a. The spatial light modulator 3a is arranged in the optical path between the reflecting surface R1 and the reflecting surface R2 and reflects the light incident thereto via the reflecting surface R1. The reflecting surface R2 of the prism 3b reflects the light incident thereto via the spatial light modulator 3a and guides the light through the output plane OP to the zoom optical system 4. FIG. 2 shows an example in which the prism 3b is integrally formed of a single optical block, but the prism 3b may also be constructed of a plurality of optical blocks.

The spatial light modulator 3a imparts spatial modulations according to positions of incidence of incident rays, to the rays incident thereto via the reflecting surface R1 and outputs the spatially modulated rays. The spatial light modulator 3a, as shown in FIG. 3, has a plurality of microscopic mirror elements (optical elements) SE arrayed two-dimensionally. For simplicity of description and illustration, FIGS. 2 and 3 show a configuration example wherein the spatial light modulator 3a has 4×4=16 mirror elements SE, but in fact the spatial light modulator 3a has many more mirror elements SE than 16 elements.

With reference to FIG. 2, among a group of rays incident along a direction parallel to the optical axis AX into the spatial light modulating unit 3, a ray L1 is incident to a mirror element SEa out of the plurality of mirror elements SE, and a ray L2 is incident to a mirror element SEb different from the mirror element SEa. Similarly, a ray L3 is incident to a mirror element SEc different from the mirror elements SEa, SEb, and a ray L4 is incident to a mirror element SEd different from the mirror elements SEa-SEc. The mirror elements SEa-SEd impart respective spatial modulations set according to their positions, to the rays L1-L4.

The spatial light modulating unit 3 is configured in a configuration wherein in a standard state in which reflecting surfaces of all the mirror elements SE of the spatial light modulator 3a are set in parallel with the YZ plane, rays incident along the direction parallel to the optical axis AX to the reflecting surface R1 travel via the spatial light modulator 3a and thereafter are reflected to the direction parallel to the optical axis AX by the reflecting surface R2. The spatial light modulating unit 3 is also configured so that an air equivalent length from the input plane IP of the prism 3b to the output plane OP via the mirror elements SEa-SEd is equal to an air equivalent length from a position corresponding to the input plane IP to a position corresponding to the output plane OP without the prism 3b in the optical path. The air equivalent length herein is an optical path length in air with the refractive index of 1 reduced from the optical path length in the optical system, and an air equivalent length in a medium with the refractive index of n is a value obtained by multiplying the optical path length by 1/n.

The spatial light modulator 3a is arranged at or near the front focus position of the zoom optical system 4. The rays reflected and given a predetermined angle distribution by the plurality of mirror elements SEa-SEd of the spatial light modulator 3a form predetermined light intensity distributions SP1-SP4 on the rear focal plane 4a of the zoom optical system 4. Namely, the zoom optical system 4 converts angles given to the output rays by the plurality of mirror elements SEa-SEd of the spatial light modulator 3a, into positions on the plane 4a being the far field region (Fraunhofer diffraction region) of the spatial light modulator 3a.

Referring again to FIG. 1, the entrance plane of the fly's eye lens 5 is positioned at or near the rear focal plane 4a of the zoom optical system 4 functioning as a condensing optical system. Therefore, the light intensity distribution (luminance distribution) of the secondary light source formed by the fly's eye lens 5 becomes a distribution according to the light intensity distributions SP1-SP4 formed by the spatial light modulator 3a and the zoom optical system 4. The spatial light modulator 3a, as shown in FIG. 3, is a movable multi-mirror including the mirror elements SE which are a large number of microscopic reflecting elements arrayed regularly and two-dimensionally along one plane in a state in which their reflecting surfaces of a planar shape are respective top faces.

Each mirror element SE is movable and an inclination of its reflecting surface, i.e., an inclination angle and inclination direction of the reflecting surface, is independently controlled by action of a drive unit 3c (which is not shown in FIG. 3) which operates in accordance with a command from a control unit CR (not shown in FIG. 3). Each mirror element SE is continuously or discretely rotatable by a desired rotation angle around axes of rotation along two mutually orthogonal directions (Y-direction and Z-direction) which are two directions parallel to its reflecting surface. Namely, the inclination of the reflecting surface of each mirror element SE can be two-dimensionally controlled.

Figure 4:
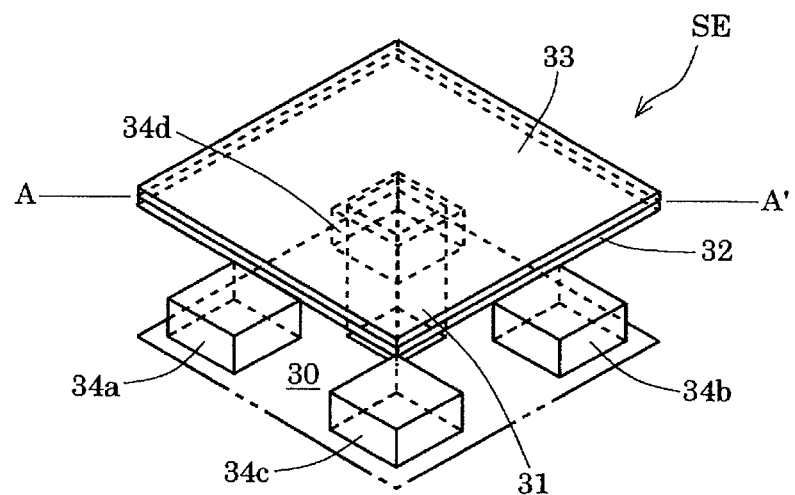
FIG. 4 is a drawing schematically showing an exemplary configuration example of one mirror element out of a plurality of mirror elements of the spatial light modulator.
Figure 5:
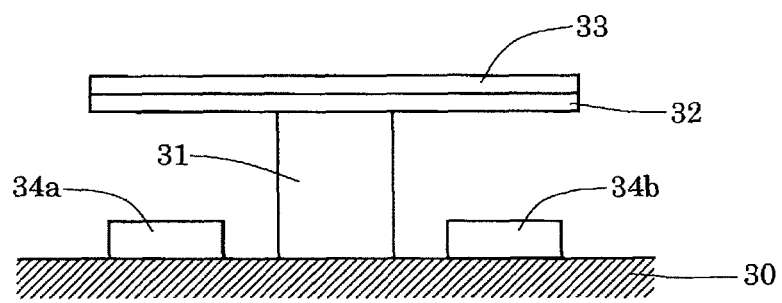
FIG. 5 is a sectional view along AA' in FIG. 4.

FIG. 4 is a drawing schematically showing a configuration example of one mirror element SE out of the plurality of mirror elements SE of the spatial light modulator 3a. FIG. 5 is a sectional view along AA' in FIG. 4. With reference to FIGS. 4 and 5, the mirror element SE is provided with a base (basis) 30, a support 31 provided on the base 30, a platelike member 32 connected to the support 31 on the opposite side to the base 30 side, a reflecting surface 33 consisting of a reflecting film formed on the platelike member 32, and four electrodes 34a-34d arranged so as to surround the support 31 on the base 30.

The platelike member 32 can be inclined around two mutually orthogonal axes on a plane parallel to the base 30, with a connection to the support 31 serving as a fulcrum. The electrodes 34a-34d are arranged at respective positions on the base 30 corresponding to the four corners of the platelike member 32. In this configuration, when a potential is applied to the electrodes 34a-34d, an electrostatic force is generated between each electrode 34a-34d and the platelike member 32 to vary a distance between each electrode 34a-34d and the platelike member 32. This causes the platelike member 32 to be inclined around a fulcrum at one end of the support 31, resulting in inclining the reflecting surface 33 formed on the platelike member 32.

When the reflecting surface of each mirror element SE is discretely rotated, a preferred control method is to switch the rotation angle among a plurality of states (e.g., . . . , −2.5°, −2.0°, . . . 0°, +0.5° . . . +2.5°, . . . ). FIG. 3 shows the mirror elements SE with the contour of a square shape, but the contour of the mirror elements SE is not limited to the square shape. However, in terms of light utilization efficiency, it is preferable to adopt a shape enabling an array with a small clearance between the mirror elements SE (shape enabling closest packing). Furthermore, in terms of light utilization efficiency, it is also preferable to adopt a configuration wherein the clearance between two adjacent element mirrors SE is reduced to the minimum necessary.

The present embodiment uses as the spatial light modulator 3a, a spatial light modulator which continuously (or discretely) varies each of orientations of the mirror elements SE arrayed two-dimensionally. The spatial light modulator of this type applicable herein can be selected, for example, from the spatial light modulators disclosed in Published Japanese Translation of PCT Application No. 10-503300 and European Patent Published Application No. 779530 corresponding thereto, Japanese Patent Application Laid-open No. 2004-78136 and U.S. Pat. No. 6,900,915 corresponding thereto, Published Japanese Translation of PCT Application No. 2006-524349 and U.S. Pat. No. 7,095,546 corresponding thereto, and Japanese Patent Application Laid-open No. 2006-113437.

In the spatial light modulator 3a, postures of the respective mirror elements SE each are varied and the mirror elements SE are set in respective predetermined orientations, by action of the drive unit 3c operating in accordance with a control signal from the control unit CR. Rays reflected at respective predetermined angles by the plurality of mirror elements SE of the spatial light modulator 3a travel through the zoom optical system 4 to form a light intensity distribution (pupil intensity distribution) of a multi-polar shape (dipolar shape, quadrupolar shape, or the like), annular shape, or the like on the illumination pupil at or near the rear focus position of the fly's eye lens 5. This pupil intensity distribution similarly (isotropically) varies by action of the zoom optical system 4.

Namely, the zoom optical system 4 and the fly's eye lens 5 constitute a distribution forming optical system which forms a predetermined light intensity distribution on the illumination pupil of the illumination optical system IL, based on a flux of light having traveled via the spatial light modulator 3a in the spatial light modulating unit 3. Furthermore, light intensity distributions corresponding to the pupil intensity distribution are also formed at other illumination pupil positions optically conjugate with the illumination pupil at or near the rear focus position of the fly's eye lens 5, i.e., at a pupil position of the field stop imaging optical system 8 and at a pupil position of the projection optical system PL (position of the aperture stop AS).

For the exposure apparatus to highly accurately and faithfully transfer the pattern of the mask M onto the wafer W, it is important, for example, to perform exposure under an appropriate illumination condition according to a pattern characteristic of the mask M. Since the present embodiment adopts the spatial light modulating unit 3 with the spatial light modulator 3a wherein the postures of the mirror elements SE each are individually varied, the pupil intensity distribution formed by action of the spatial light modulator 3a can be freely and quickly varied.

However, there is a possibility that, for example, the reflecting surfaces of the mirror elements made of aluminum will become oxidized by irradiation with light to decrease the reflectances of the reflecting surfaces of the mirror elements with time and it will become difficult to form a desired pupil intensity distribution because of influence of the reflectance decrease. There is another possibility that the mirror elements will fail to operate normally for some reason and it will become difficult to form a desired pupil intensity distribution because of influence of this operation anomaly (or mechanical deterioration). Specifically, if a mirror element has an operation anomaly, the corresponding reflecting surface of the mirror element cannot be inclined by a desired angle, for example, even with application of a designed required voltage to the electrodes.

Figure 6:
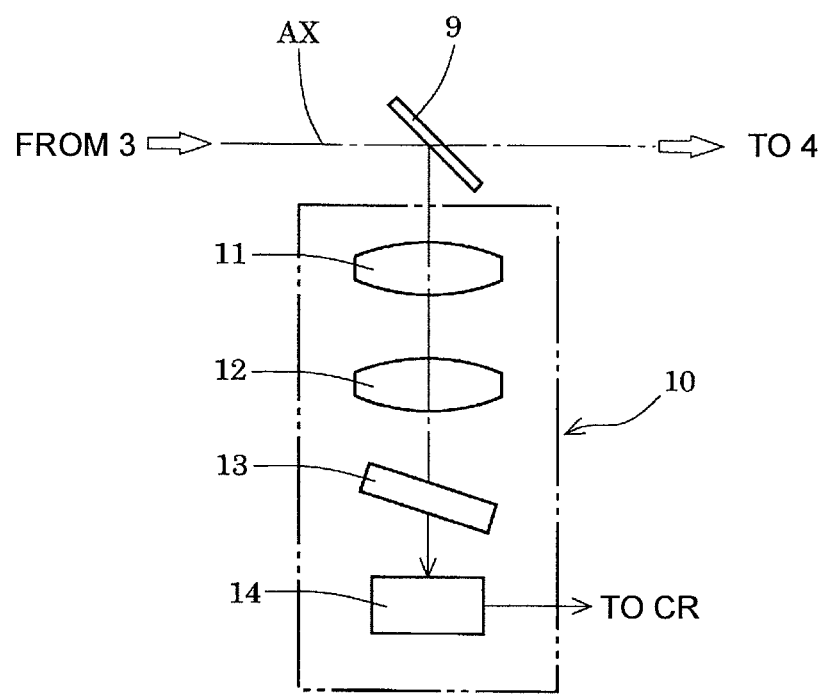
FIG. 6 is a drawing schematically showing an exemplary internal configuration of an inspection device according to the embodiment.

Therefore, the exposure apparatus of the present embodiment is provided with the inspection device 10 for inspecting the reflectance decrease and operation anomaly of the mirror elements SE of the spatial light modulator 3a arranged in the optical path of the illumination optical system IL. The inspection device 10 of the present embodiment, as shown in FIG. 6, is provided with a pair of lenses 11, 12, and a CCD 13 in order of incidence of the light from the beam splitter 9. The inspection device 10 is further provided with a signal processing unit 14 connected to the CCD 13.

In the inspection device 10, the light from the light source 1 guided to the outside of the illumination optical path by the beam splitter 9 is incident to the CCD 13 through the pair of lenses 11, 12 arranged along one optical axis. A detection surface of the CCD 13 is arranged with an inclination relative to the YZ plane so as to be made approximately coincident with a conjugate plane optically conjugate with the array plane where the plurality of mirror elements SE of the spatial light modulator 3a are arrayed, by the pair of lenses 11, 12. In other words, the pair of lenses 11, 12 constitute a conjugate optical system which is arranged optically downstream the spatial light modulator 3a and which forms the conjugate plane optically conjugate with the array plane of the optical elements SE.

The CCD 13 constitutes a photodetector having a detection surface arranged at or near the conjugate plane of the array plane of the optical elements SE formed by the pair of lenses 11, 12. In other words, there is no optical element having an optical power (or no optical element having a finite focal length) in the optical path between the conjugate optical system and the detection surface. More particularly, the CCD 13 has the number of pixels (pixel count) not less than the number of mirror elements SE of the spatial light modulator 3a and is configured so that the reflecting surface of one mirror element SE corresponds to one or more pixels of the CCD 13. It should be, however, noted that a variety of forms can be contemplated as to the configuration of the detection surface of the CCD 13 and, more generally, as to the configuration of the photodetector. An output signal of the CCD 13 is supplied to the signal processing unit 14.

In the present embodiment, for example, in a standard state in which the reflecting surfaces of all the mirror elements SE of the spatial light modulator 3a are set in parallel with the YZ plane (which usually corresponds to an initial state where the value of voltage applied to all the electrodes is 0: which will also be referred to hereinafter simply as the "standard state"), a beam with a uniform light intensity distribution is applied to every mirror element SE. In this case, if a certain mirror element SE alone undergoes the reflectance decrease, a detection signal from one or more pixels corresponding to this mirror element SE will be different from detection signals from pixels corresponding to the other mirror elements SE.

Namely, the detection signal of each pixel corresponding to the mirror element SE undergoing the decrease of reflectance becomes smaller than those of pixels corresponding to the other mirror elements SE undergoing no substantial decrease of reflectance. In this manner, the signal processing unit 14 of the inspection device 10 inspects a level of the decrease in reflectance of each mirror element SE, for example, based on the output signal of the CCD 13 in the standard state, i.e., based on the detection signals of the pixels corresponding to the respective mirror elements SE.

In the above description, the beam with the uniform light intensity distribution is applied to every mirror element SE in the standard state, for easier understanding. However, without having to be limited to this, it is also possible to apply a beam with a nonuniform predetermined light intensity distribution to some of the mirror elements SE in a predetermined state other than the standard state. In general, the signal processing unit 14 applies a beam with a predetermined light intensity distribution to a plurality of mirror elements SE in a first state, for example, like the standard state and inspects reflectances of the mirror elements SE, based on a light intensity distribution formed on the detection surface of the CCD 13 through the conjugate optical system (11, 12) by light reflected on the plurality of mirror elements SE.

In the present embodiment, a control performed is, for example, to apply a beam with a uniform light intensity distribution to every mirror element SE in the standard state and to equally change the reflecting surfaces of all the mirror elements SE by an identical angle and in an identical direction from that state. In this case, if a certain mirror element SE alone undergoes an operation anomaly, a detection signal of each pixel corresponding to this mirror element SE will be different from detection signals of pixels corresponding to the other mirror elements SE.

Namely, with the mirror element SE undergoing the operation anomaly, an angle of inclination of its reflecting surface will be smaller than those with the other mirror elements SE and therefore the detection signal of each pixel corresponding to the mirror element SE undergoing the operation anomaly will become smaller or larger than those of pixels corresponding to the normally operating mirror elements SE. In this way, the signal processing unit 14 of the inspection device 10 inspects the operation anomaly of each mirror element SE, based on the output signal of the CCD 13 in the standard state and the output signal of the CCD 13 in the state in which the postures of all the mirror elements SE are equally changed from the standard state.

In the above description, for easier understanding, the control performed is to equally change the reflecting surfaces of all the mirror elements SE by the same angle and in the same direction from the standard state. However, without having to be limited to this, it is also possible to perform a control to change a posture of a reflecting surface of at least one mirror element SE from a predetermined state other than the standard state.

In general, the signal processing unit 14 applies a beam with a predetermined light intensity distribution to a plurality of mirror elements SE in a first state, for example, like the standard state and inspects the operation of at least one mirror element SE, based on a light intensity distribution formed on the detection surface of the CCD 13 by light reflected on the plurality of mirror elements SE and a light intensity distribution formed on the detection surface of the CCD 13 by light reflected on the plurality of mirror elements SE in a second state in which the posture of the reflecting surface of at least one mirror element SE mentioned above is changed from the first state. In this way, the signal processing unit 14 constitutes an inspection unit which inspects optical characteristics such as reflectances or operations of the plurality of optical elements SE, based on the result of detection by the CCD 13 as a photodetector.

In the inspection device 10 of the present embodiment, the conjugate optical system (11, 12) is provided downstream the reflection type spatial light modulator 3*a* arranged in the optical path of the illumination optical system IL and this conjugate optical system (11, 12) arranges the array plane of the mirror elements (optical elements) SE and the detection surface of the CCD 13 as the photodetector approximately in an optically conjugate relation with each other. Therefore, as described above, the device is able to inspect the reflectances of the mirror elements SE, based on the light intensity distribution formed on the detection surface of the CCD 13 by the light reflected on the plurality of mirror elements SE in the standard state, for example.

Furthermore, as described above, the device is able to inspect the operation of at least one mirror element SE, based on the light intensity distribution formed on the detection surface of the CCD 13 by the light reflected on the plurality of mirror elements SE in the first state, for example, like the standard state and the light intensity distribution formed on the detection surface of the CCD 13 by the light reflected on the plurality of mirror elements SE in the second state in which the posture of the reflecting surface of at least one mirror element SE mentioned above is changed from the standard state. Namely, the inspection device 10 of the present embodiment is able to inspect the optical characteristics (or optical states) such as the reflectances or operations of the mirror elements SE of the reflection type spatial light modulator 3*a* arranged in the optical path of the illumination optical system IL, on an as-needed basis.

The detection result of the inspection device 10, i.e., the information about levels of reflectance decrease of the respective mirror elements SE and the information about the operation anomaly of the mirror elements SE, is supplied to the control unit CR. The control unit CR refers to the information about the reflectance and operation of each mirror element SE and controls each of the postures of the respective mirror elements SE of the spatial light modulator 3*a* through the drive unit 3*c* so as to obtain a desired pupil intensity distribution on the illumination pupil plane of the illumination optical system IL. Specifically, the control unit CR controls (or adjusts) each of the postures of the respective mirror elements SE so as to cover a reflectance change of a mirror element SE with a lowered reflectance by the other mirror elements SE, for example, using the normally operating mirror elements SE only.

In the present embodiment, as described above, a desired pupil intensity distribution is achieved while suppressing the influence of the reflectance decrease and operation anomaly of the mirror elements SE, by controlling each of the postures of the respective mirror elements SE of the spatial light modulator 3*a* and therefore optically adjusting the illumination optical system IL, based on the inspection result of the inspection device 10. As a result, the exposure apparatus of the present embodiment is able to perform excellent exposure under an appropriate illumination condition achieved, for example, according to a characteristic of a pattern of the mask M, using the illumination optical system IL achieving the desired pupil intensity distribution.

Figure 7:
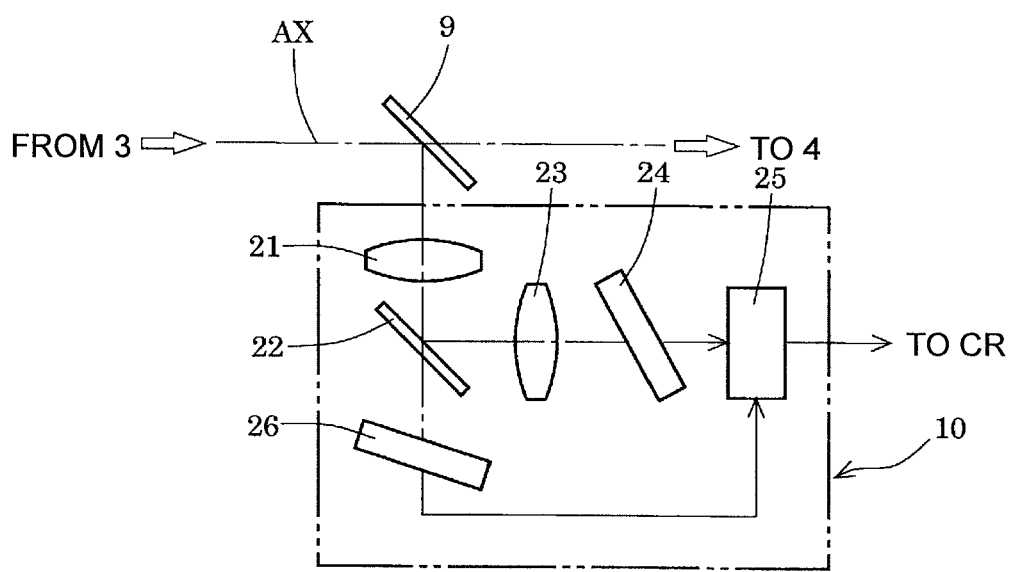
FIG. 7 is a drawing schematically showing an exemplary internal configuration of an inspection device according to a modification example of the embodiment.

FIG. 7 is a drawing schematically showing an internal configuration of an inspection device according to a modification example of the present embodiment. In the inspection device 10 according to the modification example of FIG. 7, the light guided to the outside of the illumination optical path by the beam splitter 9 travels through a lens 21 to be incident to a beam splitter 22. Light reflected by the beam splitter 22 travels through a lens 23 to be incident to a CCD 24. An output signal of the CCD 24 is supplied to a signal processing unit 25.

A detection surface of the CCD 24 is arranged with an inclination relative to the XY plane so as to be made approximately coincident with a conjugate plane optically conjugate with the array plane where the plurality of mirror elements SE of the spatial light modulator 3*a* are arrayed, by the pair of lenses 21, 23 arranged along one bent optical axis, as the CCD 13 in the embodiment of FIG. 6 is arranged. As in the case of the embodiment of FIG. 6, the CCD 24 has the number of pixels not less than the number of mirror elements SE of the spatial light modulator 3*a* and is configured so that one or more pixels of the CCD 24 correspond to a reflecting surface of one mirror element SE.

On the other hand, light transmitted by the beam splitter 22 is incident to a CCD 26. An output signal of the CCD 26 is supplied to the signal processing unit 25 as the output signal of the CCD 24 is. A detection surface of the CCD 26 is arranged with an inclination relative to the YZ plane so as to be made approximately coincident with a Fourier transform plane optically in a Fourier transform relation with the array plane where the plurality of mirror elements SE of the spatial light modulator 3a are arrayed, by the lens 21.

In other words, the lens 21 constitutes a Fourier transform optical system which is arranged optically downstream the spatial light modulator 3a and which forms a Fourier transform plane optically in a Fourier transform relation with the array plane of the optical elements SE. The CCD 26 constitutes a photodetector having a detection surface arranged at or near the Fourier transform plane of the array plane of the optical elements SE formed by the lens 21.

In the modification example of FIG. 7, as described above, the conjugate optical system (21, 23) consisting of the pair of lenses, the CCD 24, and the signal processing unit 25 constitute a first inspection system, and this first inspection system has the same configuration as the inspection device in the embodiment of FIG. 6 and thus has the same action. Namely, the signal processing unit 25 of the first inspection system is able to inspect levels of reflectance decrease of the mirror elements SE of the spatial light modulator 3a arranged in the optical path of the illumination optical system IL and to inspect the operation anomaly of the mirror elements SE at any time as needed, based on the output signal of the CCD 24.

Figure 8:
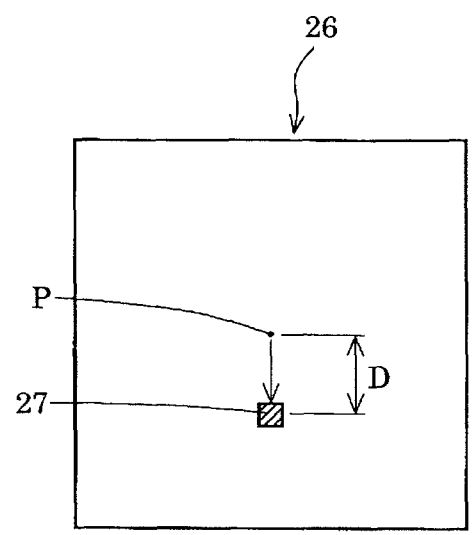
FIG. 8 is a drawing for explaining an exemplary action of a second inspection system of the inspection device according to the modification example of FIG. 7.

On the other hand, the lens 21, CCD 26, and signal processing unit 25 constitute a second inspection system. The second inspection system performs, for example, a control to apply a beam with a uniform light intensity distribution to every mirror element SE in the standard state and to change an angle of the reflecting surface of a certain mirror element SE from that state. In this case, in the standard state, light beams reflected from all the mirror elements SE are focused at a point (e.g., a center point) P on the detection surface of the CCD 26, as shown in FIG. 8.

When a voltage V applied to the electrodes of a certain mirror element SE is varied to change an angle of the reflecting surface thereof, reflected light from the mirror element SE forms a light distribution 27 at a position distant by a distance D from the point P on the detection surface of the CCD 26. There is, for example, a proportional relation between the distance D and the angle change $\alpha$ of the reflecting surface. If the mirror element SE operates normally, there is also, for example, a proportional relation between the distance D and the voltage V. In other words, if the mirror element SE suffers an operation anomaly, the relation between distance D and voltage V will deviate from the proportional relation.

In this manner, the second inspection system inspects the relation between distance D and voltage V of the mirror element SE and therefore the relation between the angle change $\alpha$ of the reflecting surface of the mirror element SE and the voltage V, based on the output signal of the CCD 26 in the standard state and the output signal of the CCD 26 in the state in which the posture of a certain mirror element SE is changed from the standard state. Here, to obtain the relation between the angle change $\alpha$ of the reflecting surface of the mirror element SE and the voltage V is nothing but to obtain a change characteristic of the posture of the mirror element SE.

In the above description, for easier understanding, the posture of a certain mirror element is changed from the standard state. However, without having to be limited to this, it is also possible to simultaneously change postures of a plurality of mirror elements (e.g., a plurality of mirror elements in a line) from a predetermined state other than the standard state, and to simultaneously inspect change characteristics of postures of these mirror elements.

In general, the signal processing unit 25 of the second inspection system applies a beam with a predetermined light intensity distribution to a plurality of mirror elements SE in a third state, for example, like the standard state, based on the output signal of the CCD 26, and inspects a change characteristic of the posture of at least one mirror element SE, based on a light intensity distribution formed on the detection surface of the CCD 26 by light reflected on the plurality of mirror elements SE and a light intensity distribution formed on the detection surface of the CCD 26 by light reflected on the plurality of mirror elements SE in a fourth state in which the posture of the reflecting surface of at least one mirror element SE mentioned above is changed from the third state.

The detection result of the inspection device 10 according to the modification example of FIG. 7, i.e., the information about levels of reflectance decrease of the respective mirror elements SE and the information about change characteristics of postures of the respective mirror elements SE, is supplied to the control unit CR. The control unit CR refers to the information about the reflectances and posture change characteristics of the respective mirror elements SE and controls each of the postures of the respective mirror elements SE of the spatial light modulator 3a through the drive unit 3c so as to obtain a desired pupil intensity distribution. Specifically, the control unit CR controls each of voltages applied to the electrodes of the respective mirror elements SE so as to cover a reflectance change of a mirror element SE with a reduced reflectance by the other mirror elements SE and so as to set the inclination angle of the reflecting surface of each mirror element SE at a desired angle.

In the modification example of FIG. 7, the device may be so configured that the first inspection system inspects an operation anomaly of each mirror element SE and that the pupil intensity distribution is formed using the normally operating mirror elements SE only. As described above, the modification example of FIG. 7 permits the device to achieve a desired pupil intensity distribution while suppressing the influence of the reflectance decrease and posture change characteristic of the mirror elements SE, by controlling each of the voltages applied to the electrodes of the respective mirror elements SE of the spatial light modulator 3a and therefore optically adjusting the illumination optical system IL, based on the inspection result of the inspection device 10.

The modification example of FIG. 7 permits the device to determine the lifetime of the spatial light modulator from the total amount of optical energy applied to the spatial light modulator, the information about levels of reflectance decrease of the respective mirror elements, the information about change characteristics of postures of the respective mirror elements, and, if necessary, the information about operation anomaly of each mirror element. Likewise, the embodiment of FIG. 6 permits the device to determine the lifetime of the spatial light modulator from the total amount of optical energy applied to the spatial light modulator, the information about levels of reflectance decrease of the respective mirror element, and the information about the operation anomaly of each mirror element.

In the modification example of FIG. 7, a part (lens 21) of the plurality of optical members (lenses 21, 23) constituting the conjugate optical system (21, 23) in the first inspection system belongs to the Fourier transform optical system. This configuration simplifies the configurations of the first and second inspection systems and also reduces error generating factors.

The inspection device according to the modification example of FIG. 7 is provided with the first inspection system for inspecting the reflectance decrease and operation anomaly of the mirror elements and the second inspection system for inspecting the change characteristics of the postures of the mirror elements, but it is needless to mention that an inspection device consisting of the second inspection system only also falls within the scope of the present invention.

In the above description, the K prism 3b integrally formed of a single optical block is used as the prism member having the optical surface opposed to the plane where the plurality of mirror elements of the spatial light modulator 3a are arrayed. However, without having to be limited to this, it is also possible to construct a prism member with the same function as the K prism 3b, by a pair of prisms. It is also possible to construct a prism member with the same function as the K prism 3b, by a plane-parallel plate and a pair of triangular prisms. It is also possible to construct an assembled optical member with the same function as the K prism 3b, by a plane-parallel plate and a pair of plane mirrors.

In the above description, the spatial light modulator in which the orientations (angles: inclinations) of the reflecting surfaces arrayed two-dimensionally can be individually controlled is used as the spatial light modulator having the plurality of optical elements arrayed two-dimensionally and controlled individually. However, without having to be limited to this, it is also possible, for example, to apply a spatial light modulator in which heights (positions) of the reflecting surfaces arrayed two-dimensionally can be individually controlled. Such a spatial light modulator applicable herein can be selected, for example, from those disclosed in Japanese Patent Application Laid-open No. 6-281869 and U.S. Pat. No. 5,312,513 corresponding thereto, and in FIG. 1d of Published Japanese Translation of PCT Application No. 2004-520618 and U.S. Pat. No. 6,885,493 corresponding thereto. These spatial light modulators are able to apply the same action as a diffracting surface, to incident light by forming a two-dimensional height distribution. The aforementioned spatial light modulator having the plurality of reflecting surfaces arrayed two-dimensionally may be modified, for example, according to the disclosure in Published Japanese Translation of PCT Application No. 2006-513442 and U.S. Pat. No. 6,891,655 corresponding thereto, or according to the disclosure in Published Japanese Translation of PCT Application No. 2005-524112 and U.S. Pat. Published Application No. 2005/0095749 corresponding thereto.

In the above description, the spatial light modulator applied is the reflection type spatial light modulator having the plurality of mirror elements, but, without having to be limited to this, it is also possible, for example, to apply the transmission type spatial light modulator disclosed in U.S. Pat. No. 5,229,872.

In the above-described embodiment, the optical system may be modified so that in the formation of the pupil intensity distribution using the spatial light modulating unit, the pupil intensity distribution is measured with a pupil luminance distribution measuring device and the spatial light modulator in the spatial light modulating unit is controlled according to the result of the measurement. Such technology is disclosed, for example, in Japanese Patent Application Laid-open No. 2006-54328 and in Japanese Patent Application Laid-open No. 2003-22967 and U.S. Pat. Published Application No. 2003/0038225 corresponding thereto.

In the aforementioned embodiment, the mask can be replaced with a variable pattern forming device which forms a predetermined pattern on the basis of predetermined electronic data. Use of such a variable pattern forming device can minimize influence on synchronization accuracy even if the pattern surface is set vertical. The variable pattern forming device applicable herein can be, for example, a DMD (Digital Micromirror Device) including a plurality of reflective elements driven based on predetermined electronic data. The exposure apparatus with the DMD is disclosed, for example, in Japanese Patent Application Laid-open No. 2004-304135 and International Publication WO2006/080285. Besides the reflective spatial light modulators of the non-emission type like the DMD, it is also possible to apply a transmission type spatial light modulator or a self-emission type image display device.

The exposure apparatus of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure apparatus include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of the exposure apparatus is desirably performed in a clean room in which the temperature, cleanliness, etc. are controlled.

Figure 9:
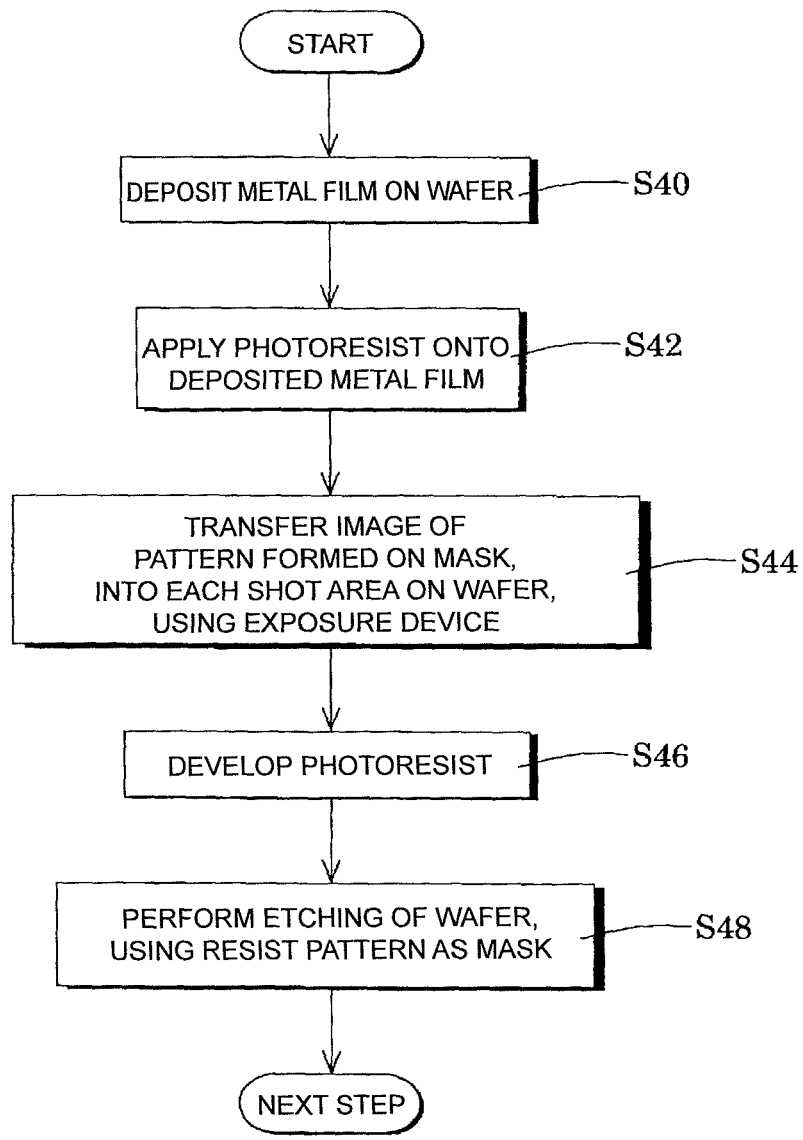
FIG. 9 is a flowchart showing exemplary manufacturing blocks of semiconductor devices.

The following will describe a device manufacturing method using the exposure apparatus according to the above-described embodiment. FIG. 9 is a flowchart showing manufacturing blocks of semiconductor devices. As shown in FIG. 9, the manufacturing blocks of semiconductor devices include depositing a metal film on a wafer W to become a substrate of semiconductor devices (block S40) and applying a photoresist as a photosensitive material onto the deposited metal film (block S42). The subsequent blocks include transferring a pattern formed on a mask (reticle) M, into each shot area on the wafer W, using the projection exposure apparatus of the above embodiment (block S44: exposure block), and developing the wafer W after completion of the transfer, i.e., developing the photoresist on which the pattern is transferred (block S46: development block). Thereafter, using the resist pattern made on the surface of the wafer W in block S46, as a mask, processing such as etching is carried out on the surface of the wafer W (block S48: processing block).

The resist pattern herein is a photoresist layer in which depressions and projections are formed in a shape corresponding to the pattern transferred by the projection exposure apparatus of the above embodiment and which the depressions penetrate throughout. Block S48 is to process the surface of the wafer W through this resist pattern.

The processing carried out in block S48 includes, for example, at least either etching of the surface of the wafer W or deposition of a metal film or the like. In block S44, the projection exposure apparatus of the above embodiment performs the transfer of the pattern onto the wafer W coated with the photoresist, as a photosensitive substrate or plate P.

Figure 10:
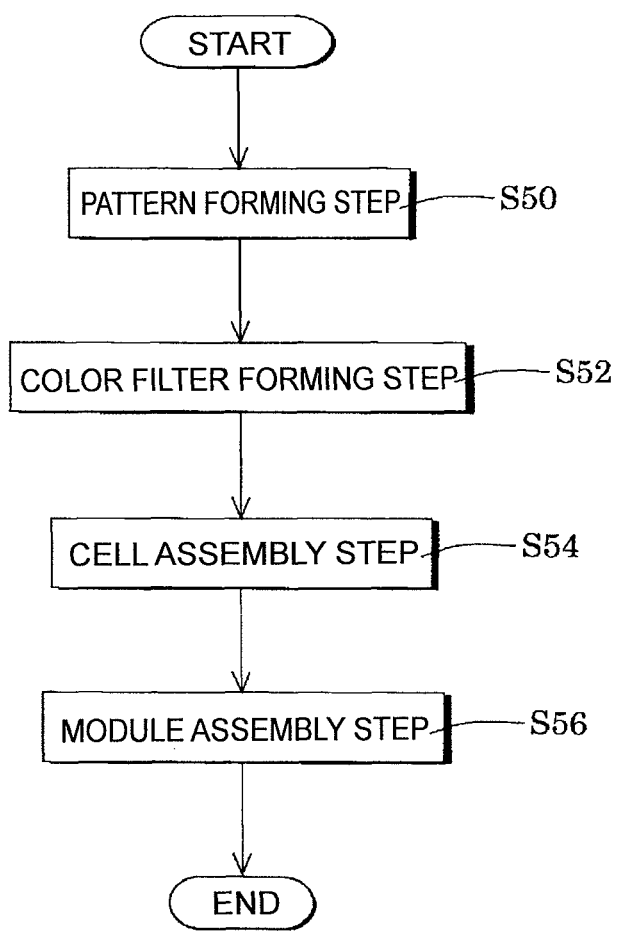
FIG. 10 is a flowchart showing exemplary manufacturing blocks of a liquid crystal device such as a liquid crystal display device.

FIG. 10 is a flowchart showing manufacturing blocks of a liquid crystal device such as a liquid crystal display device. As shown in FIG. 10, the manufacturing blocks of the liquid crystal device include sequentially performing a pattern forming step (block S50), a color filter forming step (block S52), a cell assembly step (block S54), and a module assembly step (block S56).

The pattern forming block of step S50 is to form predetermined patterns such as a circuit pattern and an electrode pattern on a glass substrate coated with a photoresist, as a plate P, using the aforementioned projection exposure apparatus of the above embodiment. This pattern forming block includes an exposure block of transferring a pattern to a photoresist layer, using the projection exposure apparatus of the above embodiment, a development block of performing development of the plate P on which the pattern is transferred, i.e., development of the photoresist layer on the glass substrate, to form the photoresist layer in the shape corresponding to the pattern, and a processing block of processing the surface of the glass substrate through the developed photoresist layer.

The color filter forming step of block S52 is to form a color filter in which a large number of sets of three dots corresponding to R (Red), G (Green), and B (Blue) are arrayed in a matrix pattern, or in which a plurality of filter sets of three stripes of R, G, and B are arrayed in a horizontal scan direction.

The cell assembly block of block S54 is to assemble a liquid crystal panel (liquid crystal cell), using the glass substrate on which the predetermined pattern has been formed in block S50, and the color filter formed in block S52. Specifically, for example, a liquid crystal is poured into between the glass substrate and the color filter to form the liquid crystal panel. The module assembly block of block S56 is to attach various components such as electric circuits and backlights for display operation of this liquid crystal panel, to the liquid crystal panel assembled in block S54.

The present invention is not limited just to the application to the exposure apparatus for manufacture of semiconductor devices, but can also be widely applied, for example, to the exposure apparatus for the liquid crystal display devices formed with rectangular glass plates, or for display devices such as plasma displays, and to the exposure apparatus for manufacture of various devices such as imaging devices (CCDs and others), micro machines, thin film magnetic heads, and DNA chips. Furthermore, the present invention is also applicable to the exposure block (exposure apparatus) for manufacture of masks (photomasks, reticles, etc.) on which mask patterns of various devices are formed, by the photolithography process.

The above-described embodiment can use the ArF excimer laser light (wavelength: 193 nm) or the KrF excimer laser light (wavelength: 248 nm) as the exposure light. Furthermore, without having to be limited to this, the present invention can also use any other appropriate laser light source, e.g., an $F_2$ laser light source which supplies laser light at the wavelength of 157 nm.

The foregoing embodiment was the application of the present invention to the illumination optical system for illuminating the mask in the exposure apparatus, but, without having to be limited to this, the present invention can also be applied to commonly-used illumination optical systems for illuminating an illumination target surface except for the mask.

In the inspection device of the embodiments of the present invention, for example, the conjugate optical system is provided optically downstream the reflection type spatial light modulator arranged in the optical path of the illumination optical system and this conjugate optical system arranges the array plane of the mirror elements of the spatial light modulator and the detection surface of the photodetector in an optically almost conjugate relation with each other. Therefore, as detailed with reference to embodiments, the reflectances of the mirror elements can be inspected, for example, based on the light intensity distribution formed on the detection surface via the conjugate optical system by light reflected on the mirror elements in a standard state of the array plane of the mirror elements.

Namely, the inspection device of the embodiments of the present invention is able to inspect the reflectances of the mirror elements of the spatial light modulator arranged in the optical path of the illumination optical system, for example, on an as-needed basis. Therefore, the illumination optical system of the embodiment of the present invention is able to achieve a desired pupil intensity distribution, for example, using the inspection device for inspecting the reflectances of the mirror elements of the spatial light modulator arranged in the optical path. The exposure apparatus of the embodiments of the present invention is able to perform excellent exposure under an appropriate illumination condition, using the illumination optical system achieving the desired pupil intensity distribution, and, in turn, to manufacture excellent devices.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

The invention claimed is:

1. An inspection device for inspecting a spatial light modulator having a plurality of optical elements arrayed two-dimensionally and controlled individually, said inspection device comprising:

a conjugate optical system which is arranged optically downstream from the spatial light modulator and which forms a conjugate plane optically conjugate with an array plane where the plurality of optical elements are arrayed;

a first photodetector having a first detection surface arranged on or near the conjugate plane;

a Fourier transform optical system which is arranged optically downstream from the spatial light modulator and which forms a Fourier transform plane optically in a Fourier transform relation with the array plane where the plurality of optical elements are arrayed;

a second photodetector having a second detection surface arranged on or near the Fourier transform plane; and an inspection unit which receives a first output of the first photodetector and a second output of the second photodetector and which inspects optical characteristics of the plurality of optical elements.

2. The inspection device according to claim 1 wherein the optical elements are mirror elements.

3. The inspection device according to claim 2, wherein the inspection unit inspects reflectances of the plurality of mirror elements, based on a light intensity distribution formed on the first detection surface through the conjugate optical system by light reflected on the plurality of mirror elements.

4. The inspection device according to claim 2, wherein the inspection unit inspects an operation of at least one mirror element, based on a light intensity distribution formed on the first detection surface by light reflected on the plurality of mirror elements in a first state of the plurality of mirror elements and a light intensity distribution formed on the first detection surface by light reflected on the plurality of mirror elements in a second state of the plurality of mirror elements in which a posture of a reflecting surface of said at least one mirror element is changed from the first state.

5. The inspection device according to claim 2, wherein the inspection unit inspects a change characteristic of a posture of at least one mirror element, based on a light intensity distribution formed on the second detection surface by light reflected on the plurality of mirror elements in a third state of the plurality of mirror elements and a light intensity distribution formed on the second detection surface by light reflected on the plurality of mirror elements in a fourth state of the plurality of mirror elements in which a posture of a reflecting surface of said at least one mirror element is changed from the third state.

6. The inspection device according to claim 2, wherein the inspection unit inspects a change characteristic of a posture of at least one mirror element, based on a light intensity distribution formed on the second detection surface by light reflected on the plurality of mirror elements in a first state of the plurality of mirror elements and a light intensity distribution formed on the second detection surface by light reflected on the plurality of mirror elements in a second state of the plurality of mirror elements in which a posture of a reflecting surface of said at least one mirror element is changed from the first state.

7. The inspection device according to claim 1, wherein a part of a plurality of optical members constituting the conjugate optical system belongs to the Fourier transform optical system.

8. The inspection device according to claim 1, wherein there is no optical element having an optical power in an optical path between the conjugate optical system and the first detection surface.

9. The inspection device according to claim 1, wherein optical members constituting the conjugate optical system are arranged along one optical axis.

10. The inspection device according to claim 1, which can be combined with an illumination optical system comprising a spatial light modulator having a plurality of optical elements arrayed two-dimensionally and controlled individually, and illuminating an illumination target surface on the basis of illumination light from a light source,
the inspection device inspecting the spatial light modulator, based on the illumination light having traveled via at least a part of the plurality of optical elements of the spatial light modulator.

11. The inspection device according to claim 10, further comprising a splitting optical member which can be arranged in an optical path between the spatial light modulator and the illumination target surface and which splits the illumination light having traveled via at least a part of the plurality of optical elements of the spatial light modulator.

12. The inspection device according to claim 11, wherein the splitting optical member can be arranged in an optical path between a zoom optical system of the illumination optical system and the spatial light modulator.

13. The inspection device according to claim 11, wherein the splitting optical member can be arranged in an optical path between an integrator of the illumination optical system and the spatial light modulator.

14. The inspection device according to claim 1, which can be combined with an illumination optical system comprising a spatial light modulator having a plurality of optical elements arrayed two-dimensionally and controlled individually, and illuminating an illumination target surface on the basis of illumination light from a light source,
the inspection device inspecting the spatial light modulator via a reflecting surface arranged between the conjugate optical system and the spatial light modulator and obliquely set with respect to an optical axis of the illumination optical system.

15. The inspection device according to claim 14, wherein each of the first and second photodetectors is obliquely set with respect to the optical axis of the conjugate optical system.

16. The inspection device according to claim 1, wherein each of the first and second photodetectors comprises a plurality of pixels and wherein a plurality of pixels correspond to one of the optical elements of the spatial light modulator.

17. The inspection device according to claim 1, the inspection device inspecting the spatial light modulator, based on a beam with a uniform light intensity distribution supplied to the plurality of optical elements of the spatial light modulator.

18. The inspection device according to claim 1, the inspection device inspecting the spatial light modulator, based on a beam with a nonuniform light intensity distribution supplied to a part of the plurality of optical elements of the spatial light modulator.

19. An illumination optical system which comprises a spatial light modulator having a plurality of optical elements arrayed two-dimensionally and controlled individually and which illuminates an illumination target surface on the basis of light from a light source, said illumination optical system comprising:
the inspection device as set forth in claim 1 for inspecting the spatial light modulator; and
a distribution forming optical system which forms a predetermined light intensity distribution on an illumination pupil of the illumination optical system, based on light having traveled via the spatial light modulator.

20. The illumination optical system according to claim 19, wherein the distribution forming optical system has an optical integrator, and a condensing optical system arranged in an optical path between the optical integrator and the spatial light modulator.

21. The illumination optical system according to claim 19, which is used in combination with a projection optical system for forming a plane optically conjugate with the illumination target surface, wherein the illumination pupil is a position optically conjugate with an aperture stop of the projection optical system.

22. An exposure apparatus comprising the illumination optical system as set forth in claim 19 for illuminating a predetermined pattern, wherein the predetermined pattern is transferred onto a photosensitive substrate to effect exposure thereof.

23. A device manufacturing method comprising:
transferring the predetermined pattern onto the photosensitive substrate to effect exposure thereof, using the exposure apparatus as set forth in claim 22;
developing the photosensitive substrate on which the predetermined pattern is transferred, to form a mask layer of a shape corresponding to the predetermined pattern on a surface of the photosensitive substrate; and
processing the surface of the photosensitive substrate through the mask layer.

24. A method for adjusting an illumination optical system which comprises a spatial light modulator having a plurality of optical elements arrayed two-dimensionally and controlled individually and which illuminates an illumination target surface on the basis of light from a light source, said method comprising:
inspecting optical characteristics of the plurality of optical elements, using the inspection device as set forth in claim 1; and optically adjusting the illumination optical system, based on a result of the inspection.

25. An inspecting method for inspecting a spatial light modulator having a plurality of optical elements arrayed two-dimensionally and controlled individually, said inspecting method comprising:
  inspecting optical characteristics of the plurality of optical elements using a first photodetector and a second photodetector,
  the first photodetector making a detection based on a light intensity distribution formed on or near a conjugate plane optically conjugate with an array plane where the plurality of optical elements are arrayed, by light having traveled via the plurality of optical elements, and
  the second photodetector making a detection based on a light intensity distribution formed on or near a Fourier transform plane optically in a Fourier transform relation with the array plane, by light having traveled via the plurality of optical elements.

26. The inspecting method according to claim 25, wherein the optical elements are mirror elements.

27. The inspecting method according to claim 26, wherein the inspecting includes inspecting reflectances of the plurality of mirror elements, based on a light intensity distribution formed on or near the conjugate plane by light reflected on the plurality of mirror elements.

28. The inspecting method according to claim 26, wherein the inspecting includes inspecting a change characteristic of a posture of at least one mirror element, based on a light intensity distribution formed on or near the Fourier transform plane by light reflected on the plurality of mirror elements in a first state of the plurality of mirror elements and a light intensity distribution formed on or near the Fourier transform plane by light reflected on the plurality of mirror elements in a second state of the plurality of mirror elements in which a posture of a reflecting surface of said at least one mirror element is changed from the first state.

29. A method for adjusting an illumination optical system which comprises a spatial light modulator having a plurality of optical elements arrayed two-dimensionally and controlled individually and which illuminates an illumination target surface on the basis of light from a light source, said method comprising:
  inspecting optical characteristics of the plurality of optical elements, using the inspecting method as set forth in claim 25; and
  optically adjusting the illumination optical system, based on a result of the inspection.

* * * * *